(12) United States Patent
Sargent et al.

(10) Patent No.: US 8,415,192 B2
(45) Date of Patent: Apr. 9, 2013

(54) COLLOIDAL NANOPARTICLE MATERIALS FOR PHOTODETECTORS AND PHOTOVOLTAICS

(75) Inventors: Edward Hartley Sargent, Toronto (CA); Jiang Tang, Toronto (CA)

(73) Assignee: InVisage Technologies, Inc., Menlo Park, CA (US)

( * ) Notice: Subject to any disclaimer, the term of this patent is extended or adjusted under 35 U.S.C. 154(b) by 0 days.

(21) Appl. No.: 13/235,159

(22) Filed: Sep. 16, 2011

(65) Prior Publication Data

US 2012/0189532 A1  Jul. 26, 2012

Related U.S. Application Data

(63) Continuation of application No. 12/426,854, filed on Apr. 20, 2009, now abandoned, which is a continuation-in-part of application No. 12/106,256, filed on Apr. 18, 2008, now Pat. No. 7,923, 801.

(60) Provisional application No. 61/046,390, filed on Apr. 18, 2008, provisional application No. 61/048,453, filed on Apr. 28, 2008, provisional application No. 61/051,445, filed on May 8, 2008, provisional application No. 60/912,581, filed on Apr. 18, 2007, provisional application No. 60/958,846, filed on Jul. 9, 2007, provisional application No. 60/970,211, filed on Sep. 5, 2007, provisional application No. 61/026,440, filed on Feb. 5, 2008, provisional application No. 61/026, 650, filed on Feb. 6, 2008, provisional application No. 61/028,481, filed on Feb. 13, 2008, provisional application No. 61/046,379, filed on Apr. 18, 2008.

(51) Int. Cl.
*H01L 21/00* (2006.01)

(52) U.S. Cl. ............ 438/63; 438/82; 257/21; 257/40; 257/E31.033; 257/E31.036; 257/E31.04; 257/E51.015; 977/830; 977/900; 977/932

(58) Field of Classification Search ............... 438/63, 438/82; 257/21, 40, E31.033, E31.036, E31.04, 257/E51.015; 977/830, 932, 900
See application file for complete search history.

(56) References Cited

U.S. PATENT DOCUMENTS 3,586,760 A   6/1971   Dillenburger et al.
4,551,397 A   11/1985  Yaguchi et al.
(Continued)

FOREIGN PATENT DOCUMENTS

EP   2432015 A1   3/2012
GB   2328338 A    2/1999
(Continued)

OTHER PUBLICATIONS

"U.S. Appl. No. 13/209,264, Restriction Requirement mailed Jan. 13, 2012", 5pgs.

(Continued)

*Primary Examiner* — Tu-Tu Ho
(74) *Attorney, Agent, or Firm* — Schwegman Lundberg & Woessner, P.A.

(57) ABSTRACT

A composite material is described. The composite material comprises semiconductor nanocrystals, and organic molecules that passivate the surfaces of the semiconductor nanocrystals. One or more properties of the organic molecules facilitate the transfer of charge between the semiconductor nanocrystals. A semiconductor material is described that comprises p-type semiconductor material including semiconductor nanocrystals. At least one property of the semiconductor material results in a mobility of electrons in the semiconductor material being greater than or equal to a mobility of holes. A semiconductor material is described that comprises n-type semiconductor material including semiconductor nanocrystals. At least one property of the semiconductor material results in a mobility of holes in the semiconductor material being greater than or equal to a mobility of electrons.

3 Claims, 29 Drawing Sheets

U.S. PATENT DOCUMENTS

| | | | |
|---|---|---|---|
| 4,644,406 A | 2/1987 | Nishigaki et al. |
| 4,866,291 A | 9/1989 | Shimada et al. |
| 4,882,295 A | 11/1989 | Czubatyj et al. |
| 5,057,682 A | 10/1991 | Michon et al. |
| 5,202,579 A | 4/1993 | Fujii et al. |
| 5,225,921 A | 7/1993 | Audas et al. |
| 5,399,880 A | 3/1995 | Chand |
| 5,446,286 A | 8/1995 | Bhargava |
| 5,462,898 A | 10/1995 | Chen et al. |
| 5,567,956 A | 10/1996 | Yamanobe et al. |
| 5,608,255 A | 3/1997 | Martin et al. |
| 5,972,178 A | 10/1999 | Narasimhan et al. |
| 5,985,176 A | 11/1999 | Rao |
| 6,163,029 A | 12/2000 | Yamada et al. |
| 6,300,612 B1 | 10/2001 | Yu |
| 6,373,117 B1 | 4/2002 | Theil |
| 6,483,116 B1 | 11/2002 | Kozlowski et al. |
| 6,657,195 B1 | 12/2003 | Martin et al. |
| 6,660,381 B2 | 12/2003 | Halas et al. |
| 6,710,366 B1 | 3/2004 | Lee et al. |
| 6,794,265 B2 | 9/2004 | Lee et al. |
| 6,819,845 B2 | 11/2004 | Lee et al. |
| 6,878,871 B2 | 4/2005 | Scher et al. |
| 6,961,499 B2 | 11/2005 | Lee et al. |
| 7,005,669 B1 | 2/2006 | Lee |
| 7,020,372 B2 | 3/2006 | Lee et al. |
| 7,042,003 B2 | 5/2006 | Jang et al. |
| 7,099,056 B1 | 8/2006 | Kindt |
| 7,358,525 B2 | 4/2008 | Lee |
| 7,402,832 B2 | 7/2008 | Lee |
| 7,442,320 B2 | 10/2008 | Lee |
| 7,488,986 B2 | 2/2009 | Yamazaki et al. |
| 7,521,737 B2 | 4/2009 | Augusto |
| 7,566,899 B2 | 7/2009 | Chabinyc et al. |
| 7,598,482 B1 | 10/2009 | Verhulst et al. |
| 7,641,815 B2 | 1/2010 | Varadarajan et al. |
| 7,816,866 B2 | 10/2010 | Nakajima et al. |
| 7,923,801 B2 | 4/2011 | Tian et al. |
| 8,004,057 B2 | 8/2011 | Tian et al. |
| 8,013,412 B2 | 9/2011 | Tian |
| 8,269,260 B2 | 9/2012 | Tian et al. |
| 8,269,302 B2 | 9/2012 | Tian et al. |
| 2001/0055008 A1 | 12/2001 | Young et al. |
| 2002/0005844 A1 | 1/2002 | Kosaka et al. |
| 2002/0177670 A1 | 11/2002 | Kusakabe et al. |
| 2002/0179930 A1 | 12/2002 | Irwin et al. |
| 2003/0063706 A1 | 4/2003 | Ikeda et al. |
| 2003/0071196 A1 | 4/2003 | Seitz |
| 2003/0103153 A1 | 6/2003 | Fossum |
| 2003/0146389 A1 | 8/2003 | Busse et al. |
| 2003/0151107 A1 | 8/2003 | Yamada et al. |
| 2004/0046194 A1 | 3/2004 | Kozuka et al. |
| 2004/0108517 A1 | 6/2004 | Moussy et al. |
| 2004/0108564 A1 | 6/2004 | Mitra |
| 2004/0118448 A1 | 6/2004 | Scher et al. |
| 2004/0150729 A1 | 8/2004 | Nishizawa et al. |
| 2004/0250750 A1 | 12/2004 | Reda et al. |
| 2005/0045910 A1 | 3/2005 | Taylor et al. |
| 2005/0079659 A1 | 4/2005 | Duan et al. |
| 2005/0139966 A1 | 6/2005 | Scarlete |
| 2005/0201149 A1 | 9/2005 | Duan et al. |
| 2005/0205850 A1 | 9/2005 | Whiteford et al. |
| 2005/0205879 A1 | 9/2005 | Fukunaga |
| 2005/0205901 A1 | 9/2005 | Suzuki |
| 2005/0214967 A1 | 9/2005 | Scher et al. |
| 2005/0225655 A1 | 10/2005 | Suzuki |
| 2005/0263839 A1 | 12/2005 | Suzuki |
| 2006/0044438 A1 | 3/2006 | Mauritzson et al. |
| 2006/0044554 A1 | 3/2006 | Mertz et al. |
| 2006/0054987 A1 | 3/2006 | Nii |
| 2006/0119724 A1 | 6/2006 | Inuiya |
| 2006/0172133 A1 | 8/2006 | Naasani |
| 2006/0181629 A1 | 8/2006 | Miyashita et al. |
| 2006/0196537 A1 | 9/2006 | Narkis et al. |
| 2006/0261331 A1 | 11/2006 | Yukawa |
| 2006/0261996 A1 | 11/2006 | Augusto et al. |
| 2006/0267054 A1 | 11/2006 | Martin et al. |
| 2007/0006914 A1 | 1/2007 | Lee |
| 2007/0045514 A1 | 3/2007 | McKee et al. |
| 2007/0052051 A1 | 3/2007 | Osaka et al. |
| 2007/0052055 A1 | 3/2007 | McKee |
| 2007/0108487 A1 | 5/2007 | Inoue et al. |
| 2007/0120045 A1 | 5/2007 | Yokoyama |
| 2007/0132867 A1 | 6/2007 | Rhee et al. |
| 2007/0153109 A1 | 7/2007 | Lule |
| 2007/0162263 A1 | 7/2007 | Forrest |
| 2007/0174939 A1 | 7/2007 | Sargent et al. |
| 2007/0216777 A1 | 9/2007 | Quan et al. |
| 2007/0221986 A1* | 9/2007 | Kang et al. ................ 257/316 |
| 2007/0236590 A1 | 10/2007 | Harris |
| 2007/0272995 A1 | 11/2007 | King et al. |
| 2007/0273775 A1 | 11/2007 | Jiang |
| 2008/0017845 A1 | 1/2008 | Drndic et al. |
| 2008/0035965 A1 | 2/2008 | Hayashi et al. |
| 2008/0067387 A1 | 3/2008 | Mouttet |
| 2008/0087800 A1 | 4/2008 | Toda |
| 2008/0142856 A1 | 6/2008 | Sato et al. |
| 2008/0156371 A1 | 7/2008 | Locascio et al. |
| 2008/0173964 A1 | 7/2008 | Akram |
| 2008/0296534 A1 | 12/2008 | Lifshitz et al. |
| 2009/0152664 A1 | 6/2009 | Klem et al. |
| 2009/0174022 A1 | 7/2009 | Coe-Sullivan et al. |
| 2009/0217973 A1 | 9/2009 | Alivisatos et al. |
| 2009/0224351 A1 | 9/2009 | Hsieh |
| 2009/0257671 A1 | 10/2009 | Fridrich et al. |
| 2010/0003187 A1* | 1/2010 | Guo et al. ................ 423/509 |
| 2010/0018578 A1 | 1/2010 | Yu et al. |
| 2010/0019334 A1 | 1/2010 | Ivanov et al. |
| 2010/0019335 A1 | 1/2010 | Ivanov et al. |
| 2010/0044676 A1 | 2/2010 | Sargent et al. |
| 2010/0187404 A1 | 7/2010 | Klem |
| 2010/0187408 A1 | 7/2010 | Klem |
| 2011/0297815 A1 | 12/2011 | Tian et al. |
| 2011/0297915 A1 | 12/2011 | Tian et al. |
| 2011/0303897 A1 | 12/2011 | Tian et al. |
| 2011/0303898 A1 | 12/2011 | Tian et al. |
| 2011/0309236 A1 | 12/2011 | Tian et al. |
| 2011/0309238 A1 | 12/2011 | Tian et al. |
| 2012/0037789 A1 | 2/2012 | Tian et al. |
| 2012/0037887 A1 | 2/2012 | Tian et al. |
| 2012/0043455 A1 | 2/2012 | Tian et al. |
| 2012/0049045 A1 | 3/2012 | Tian et al. |
| 2012/0049311 A1 | 3/2012 | Tian et al. |
| 2012/0056074 A1 | 3/2012 | Tian et al. |
| 2012/0056075 A1 | 3/2012 | Tian et al. |
| 2012/0056076 A1 | 3/2012 | Tian et al. |
| 2012/0056160 A1 | 3/2012 | Tian et al. |
| 2012/0056289 A1 | 3/2012 | Tian et al. |
| 2012/0059819 A1 | 3/2012 | Wheeler et al. |
| 2012/0180856 A1 | 7/2012 | Sargent et al. |
| 2012/0189532 A1 | 7/2012 | Sargent et al. |
| 2012/0205624 A1 | 8/2012 | Sargent et al. |
| 2013/0001520 A1 | 1/2013 | Sargent et al. |

FOREIGN PATENT DOCUMENTS

| | | | |
|---|---|---|---|
| WO | WO-2008131313 A2 | 10/2008 |
| WO | WO-2008131313 A2 | 10/2008 |
| WO | WO-2009129540 A1 | 10/2009 |
| WO | WO-2010082955 A1 | 7/2010 |

OTHER PUBLICATIONS

"U.S. Appl. No. 13/214,582, *Ex Parte Quayle* Action mailed Feb. 22, 2012", 5 pgs.

"U.S. Appl. No. 13/214,711, Non Final Office Action Mailed Jan. 17, 2012", 8 pgs.

"U.S. Appl. No. 13/214,835, Non Final Office Action mailed Feb. 21, 2012", 11 pgs.

"U.S. Appl. No. 13/218,401, Non Final Office Action mailed Feb. 22, 2012", 9 pgs.

"U.S. Appl. No. 13/218,761, Non Final Office Action mailed Feb. 21, 2012", 15 pgs.

"European Application Serial No. 08746379.0—Office Action Jan. 16, 2012", 4 pgs.

"European Application Serial No. 11008006.6, Office Action mailed Feb. 22, 2012", 10 pgs.

"U.S. Appl. No. 12/106,256, Preliminary Amendment filed Mar. 19, 2010", 10 pgs.

"U.S. Appl. No. 12/106,256, Response filed Mar. 4, 2010 to Restriction Requirement mailed Feb. 5, 2010", 10 pgs.

"U.S. Appl. No. 12/106,256, Response filed May 7, 2010 to Restriction Requirement mailed Apr. 7, 2010", 7 pgs.

"U.S. Appl. No. 12/106,256, Supplemental Preliminary Amendment filed May 21, 2010", 14 pgs.

"U.S. Appl. No. 12/426,854 Non-Final Office Action mailed Nov. 2, 2010", 7 pgs.

"U.S. Appl. No. 12/426,854, Notice of Allowance mailed May 27, 2011", 5 pgs.

"U.S. Appl. No. 12/426,854, Notice of Allowance mailed Oct. 11, 2011", 6 pgs.

"U.S. Appl. No. 12/426,854, Preliminary Amendment filed Sep. 30, 2009", 3 pgs.

"U.S. Appl. No. 12/426,854, Response filed May 2, 2011 to Non Final Office Action mailed Nov. 2, 2010", 6 pgs.

"U.S. Appl. No. 12/728,184, 312 Amendment filed Jul. 21, 2011", 6 pgs.

"U.S. Appl. No. 12/728,184, PTO Response to 312 Amendment mailed Jul. 26, 2011", 2 pgs.

"U.S. Appl. No. 12/728,184, Supplemental Notice of Allowability mailed Jun. 29, 2011", 3 pgs.

"U.S. Appl. No. 13/209,264, Preliminary Amendment filed Sep. 19, 2011", 30 pgs.

"U.S. Appl. No. 13/213,932, Non Final Office Action mailed Nov. 28, 2011", 11 pgs.

"U.S. Appl. No. 13/214,582, Notice of Allowance mailed Nov. 4, 2011", 8 pgs.

"U.S. Appl. No. 13/214,898, Non Final Office Action mailed Nov. 7, 2011", 16 pgs.

"International Application Serial No. PCT/US2009/041153, International Search Report mailed Aug. 19, 2009", 1 pg.

"International Application Serial No. PCT/US2009/041153, International Written Opinion mailed Aug. 19, 2009", 3 pgs.

Borgefors, et al., "A Semiregular image grid", Journal of Visual Communication and image representation, Vol. No. 1 No. 2, (Nov. 1, 1990), 127-136.

Cashman, R. J, "Film-Type Infrared Photoconductors", Proceedings of the IRE, 47(9), (1959), 1471-1475.

Fischbein, M. D, et al., "CdSe nanocrystal quantum-dot memory", Applied Physics Letters, 86, (2005), 193106-1-193106-3.

Takada, Shunji, et al., "CMOS Image Sensor with Organic Photoconductive Layer Having Narrow Absorption Band and Proposal of Stack Type Solid-State Image Sensors", Sensors, Cameras, and Systems for Scientific/Industrial Applications, VII, edited by Morley M. Blouke, Proc. of SPIE-IS&T Electronic Imaging, SPIE vol. 6068, 6068A, (2006), 6068A-1-6068A-8.

Ye, Zhengmao, et al., "InAs quantum dot infrared photodetectors with $In_{0.15}Ga_{0.85}As$ strain-relief cap layers", Journal of Applied Physics, 92(12), (Dec. 15, 2002), 7462-7468.

"U.S. Appl. No. 13/228,197, Non Final Office Action mailed Jan. 16, 2013", 9 pgs.

"U.S. Appl. No. 13/228,197, Preliminary Amendment mailed Apr. 20, 2012", 4 pgs.

"U.S. Appl. No. 13/235,134 , Response filed Jan. 11, 2013 to Non Final Office Action mailed Jul. 12, 2012", 7 pgs.

"U.S. Appl. No. 13/235,134, Non Final Office Action mailed Jul. 12, 2012", 7 pgs.

"U.S. Appl. No. 13/235,134, Preliminary Amendment mailed Apr. 30, 2012", 4 pgs.

"U.S. Appl. No. 13/235,185 , Response filed Nov. 19, 2012 to Non Final Office Action mailed May 21, 2012", 8 pgs.

"U.S. Appl. No. 13/235,185, Final Office Action mailed Dec. 12, 2012", 9 pgs.

"U.S. Appl. No. 13/235,185, Non Final Office Action mailed May 21, 2012", 8 pgs.

"U.S. Appl. No. 13/235,185, Preliminary Amendment mailed Mar. 30, 2012", 5 pgs.

"European Application Serial No. 11008006.6, Office Action mailed Oct. 28, 2011", 4 pgs.

"International Application Serial No. PCT/US2009/041153, International Preliminary Report on Patentability mailed Oct. 28, 2010", 5 pgs.

Buhro, William, et al., "Semiconductor Nanocrystals: Shape Matters", Nature Materials, vol. 2, (Mar. 2003), 138-139.

US 8,022,391, 09/2011, Sargent et al. (withdrawn)

* cited by examiner

| Source (filter) | $V_{OC}$ (V) | $J_{SC}$ (mA cm$^{-2}$) | PCE (%) |
|---|---|---|---|
| 975 nm 12 mW cm$^{-2}$ | 0.30 | 3.5 (37% EQE) | 4.2 |
| 1550 nm 15 mW cm$^{-2}$ | 0.29 | 2.5 (13% EQE) | 2.1 |
| Solar 100 mW cm$^{-2}$ | 0.33 | 12.3 | 1.8 |
| Solar (a-Si) 44 mW cm$^{-2}$ | 0.31 | 5.4 | 1.8 |
| Solar (GaAs) 25 mW cm$^{-2}$ | 0.28 | 2.3 | 1.3 |

| Treatment duration (1st layer:2nd layer) | $I_{SC}(mA/cm^2)$ | $V_{oc}(V)$ | FF (%) | $\eta$ (%) |
|---|---|---|---|---|
| 10:30 | 4.40 | 0.25 | 40 | 3.65 |
| 20:20 | 3.88 | 0.15 | 34 | 1.65 |
| 10:10 | 2.76 | 0.19 | 45 | 1.95 |

FIG. 7

| Region | Relevant Thickness (nm) | Absorption (%) | IQE (%) | Percentage Contributed to Overall EQE |
|---|---|---|---|---|
| Depletion | 65 | 13 | >90% | >12 |
| Quasi-neutral | 145 | 30 | 65 | 20 |
| | | | Total Measured EQE: | 32% |

FIG. 12

FIG.13
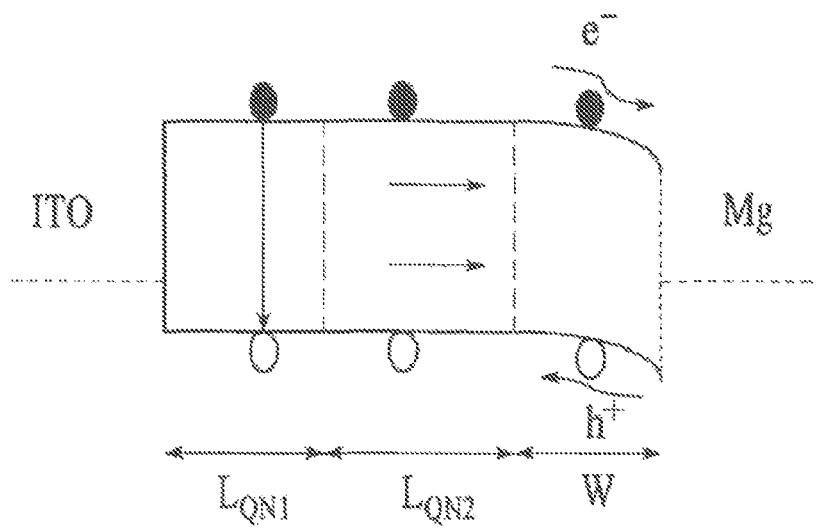
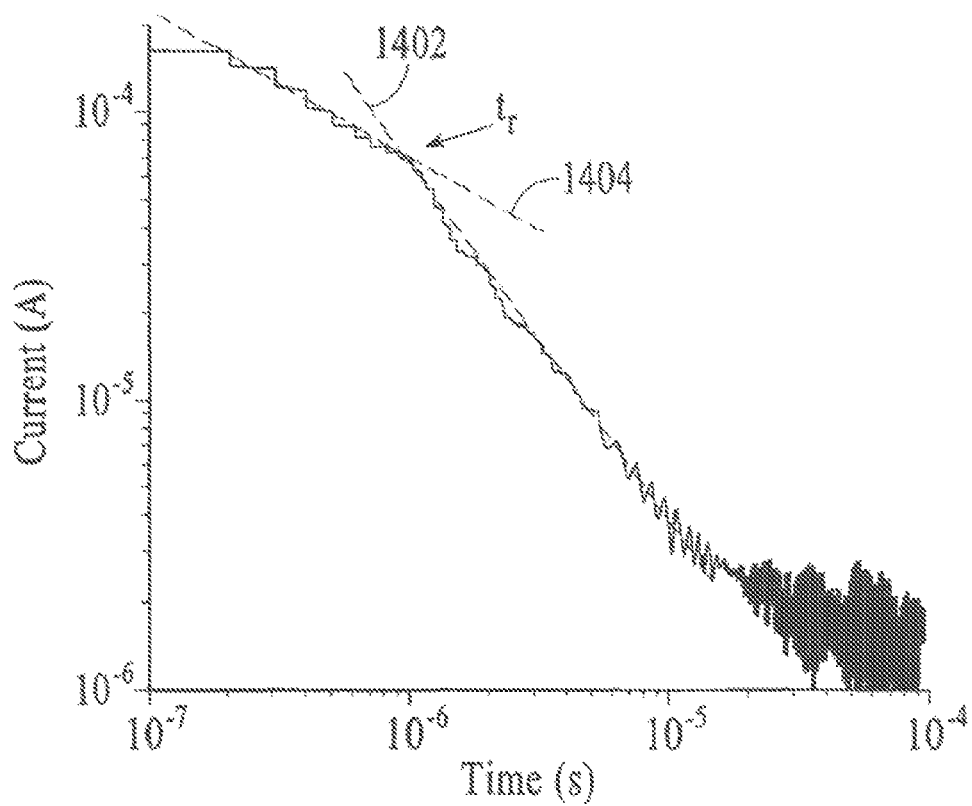
FIG.14

| Carriers | Mobility(cm²/Vs) | Recombination Lifetime (μs) | Drift Length (μm) | Diffusion Length (nm) |
|---|---|---|---|---|
| Electrons | $1.4 \times 10^{-3}$ | >13 | 8.5 | 220 |
| Holes | $2.4 \times 10^{-3}$ | >13 | 14.5 | 285 |

| Precursor atomic ratio Cu : Ga : In : Se | Cu at % | Ga at % | In at % | Se at % | Calculated Formula |
|---|---|---|---|---|---|
| 4 : 2 : 2 : 8 | 27.3 | 10.4 | 11.2 | 51.1 | $CuGa_{0.38}In_{0.41}Se_{1.87}$ |
| 4 : 3 : 1 : 8 | 28.4 | 13.4 | 8.5 | 49.7 | $CuGa_{0.47}In_{0.30}Se_{1.75}$ |
| 3 : 2 : 2 : 8 | 23.7 | 9.7 | 19.7 | 46.9 | $CuGa_{0.41}In_{0.83}Se_{1.98}$ |

FIG.29

COLLOIDAL NANOPARTICLE MATERIALS FOR PHOTODETECTORS AND PHOTOVOLTAICS

RELATED APPLICATIONS

The present application is a continuation of U.S. patent application Ser. No. 12/426,854, filed on Apr. 20, 2009 now abandoned, which claims the benefit of priority under 35 U.S.C. 119(e) to U.S. Provisional Patent Application Ser. No. 61/046,390, filed on Apr. 18, 2008, U.S. Provisional Patent Application Ser. No. 61/048,453, filed on Apr. 28, 2008, and U.S. Provisional Patent Application Ser. No. 61/051,445, filed on May 8, 2008, and further, is a continuation-in-part of U.S. patent application Ser. No. 12/106,256, filed on Apr. 18, 2008, now issued as U.S. Pat. No. 7,923,801, which claims the benefit of priority under 35 U.S.C. 119(e) to U.S. Provisional Patent Application Ser. No. 60/912,581, filed on Apr. 18, 2007, U.S. Provisional Patent Application Ser. No. 60/958,846, filed on Jul. 9, 2007, U.S. Provisional Patent Application Ser. No. 60/970,211, filed on Sep. 5, 2007, U.S. Provisional Patent Application Ser. No. 61/026,440, filed on Feb. 5, 2008, U.S. Provisional Patent Application Ser. No. 61/026,650, filed on Feb. 6, 2008, U.S. Provisional Patent Application Ser. No. 61/028,481, filed on Feb. 13, 2008, and U.S. Provisional Patent Application Ser. No. 61/046,379, filed on Apr. 18, 2008, all of which are incorporated herein by reference in their entireties.

TECHNICAL FIELD

The disclosure herein relates generally to optical and electronic devices, systems and methods that include optically sensitive material, such as nanocrystals or other optically sensitive material, and methods of making and using the devices and systems.

BACKGROUND

Half of the sun's power reaching the earth lies in the infrared, but this power is currently underutilized in large-area, low-cost photovoltaics. Early progress towards infrared solution-processed photovoltaics has emerged in organic materials; however, low-bandgap conjugated polymer/fullerene-derivative bulk heterojunctions remain sensitive only to 1000 nanometers (nm). Several other efforts have focused on sensitizing organic devices to the infrared using conjugated polymers/nanocrystal composites, but efficiencies are still well below the best organic bulk-heterojunction devices. Recent results have shown that it is possible to make efficient photovoltaic devices comprising only nanocrystals films; the most efficient nanorod heterojunction devices show response to 800 nm.

Conjugated polymers have been widely investigated and have shown promising efficiencies. However, they remain transparent in most of the infrared spectral region. Because half the sun's energy lies in the infrared, the optimal bandgap for a single-junction solar cell lies in the infrared, well beyond the sensitivity of today's organic solar cells.

In contrast with organics and polymers, colloidal quantum dots (CQDs) offer tuning to access different spectral regions through simple variation of their chemical synthesis. By virtue of their size-tunable optical properties, lead salt colloidal quantum dots (CQD) can be engineered to access the visible and the short-wavelength infrared spectral regions. Recently, organic polymers sensitized using infrared lead salt nanocrystals have been investigated; however, these devices did not exceed monochromatic power conversion efficiencies of 0.1%. Relatively higher (e.g., 1.3%) monochromatic infrared power conversion efficiencies have been reported through the use of thiols and high temperature processes to achieve smooth films on rough nanoporous transparent metal oxides. The highest infrared monochromatic external quantum efficiencies (EQE) achieved has been reported as 37% under 12 mW cm$^{-2}$ illumination at 975 nm. These PbS CQD-based devices registered an infrared power conversion efficiency of 4.2%.

Solution-processed photovoltaics offer solar energy harvesting characterized by low cost, ease of processing, physical flexibility, and large area coverage. Conjugated polymers, inorganic nanocrystals (NCs), and hybrid materials have been widely investigated and optimized to this purpose. Organic solar cells have already achieved 6.5% solar conversion efficiencies. However, these devices fail to harvest most of the infrared (IR) spectral region. High efficiency muttijunction solar cells offer the prospect of exceeding 40% efficiency through the inclusion of infrared-bandgap materials. In this context, infrared single junction solar cells should be optimized for infrared power conversion efficiency rather than solar power conversion efficiency. For double and triple junction solar cells, the smallest-bandgap junction optimally lies at 1320 nm and 1750 nm respectively. Attempts to extend organic solar cell efficiency into the near infrared have so far pushed the absorption onset only to 1000 nm.

INCORPORATION BY REFERENCE

Each patent, patent application, and/or publication mentioned in this specification is herein incorporated by reference in its entirety to the same extent as if each individual patent, patent application, and/or publication was specifically and individually indicated to be incorporated by reference.

BRIEF DESCRIPTION OF THE DRAWINGS

FIG. 7 shows a table summarizing the best performances of differently processed devices recorded under 12 mW cm$^{-2}$ illumination at 975 nm, under an embodiment.

FIG. 12 summarizes the contribution of the depletion and quasi-neutral regions to the EQE under 12 mW cm$^{-2}$ intensity at 975 nm, under an embodiment.

FIG. 13 is a schematic diagram of the analytical model used in determining where electron-hole pairs were generated, under an embodiment.

FIG. 14 shows a representative ToF transient plot.

FIG. 29 shows composition of CIGS nanoparticles of an embodiment calculated from Inductively Coupled Plasma Atomic Emission Spectrometry (ICP).

DETAILED DESCRIPTION

Figure 1A:
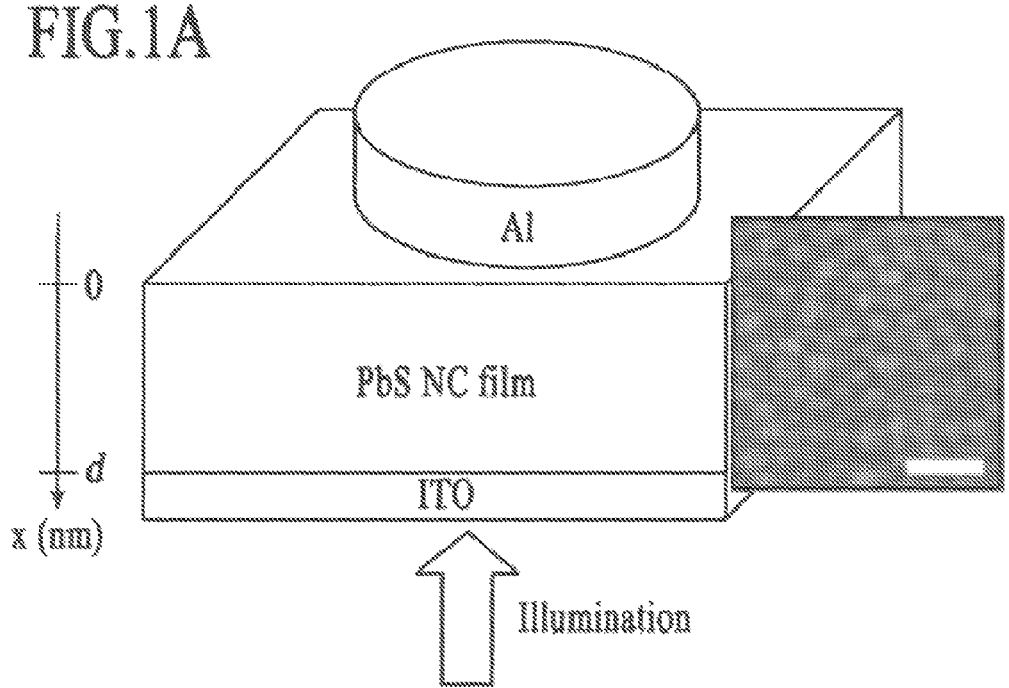
FIG. 1A shows the device architecture comprising Al on a PbS nanocrystal (NC) film, under an embodiment.

Large-area, low-cost light sensors and energy harvesters based on solution-processed semiconductors are of wide interest. In both light sensors and energy harvesters, devices have high longevity, including under intense illumination, and at high temperatures, are desired. Additional properties desired for light sensors include but are not limited to the following: high photocurrent including large external quantum efficiency (electrons of primary photocurrent per second per photon incident per second) and, in embodiments, large gain (electrons of total photocurrent per second per photon incident per second); low dark currents; a high ratio of photocurrent to dark current for a given level of illumination; rapid temporal response compatible with imaging. Additional properties desired for energy harvesters include but are not limited to the following: efficient conversion of optical power of a particular wavelength into electrical power (a high monochromatic power conversion efficiency); efficient conversion of a band of wavelengths into electrical power (in the case of the totality of the sun's spectrum, a high solar AM1.5 power conversion efficiency); relatively large external quantum efficiency; relatively large open-circuit voltage; relatively large fill-factor.

The embodiments described herein include the realization of materials having the aforementioned properties. Embodiments described herein include a composite material comprising semiconductor nanocrystal and organic molecules. The organic molecules passivate the surfaces of the semiconductor nanocrystals, and facilitate the transfer of charge between the semiconductor nanocrystals. Enhancements in the mobility of at least one type of charge carrier (e.g., electrons, holes, both electrons and holes) are achieved in an embodiment via delocalization of at least one type of carrier across at least a portion of the organic molecule employed in passivation. In embodiments, a p-type semiconductor material comprises semiconductor nanocrystals where the mobility of holes is greater than or equal to the mobility of electrons. In embodiments, at least one benzene ring forms at least a portion of the organic molecules and provides delocalization of at least one type of charge carrier, such as electrons, thereby facilitating the transport of that type of charge carrier.

The embodiments described herein further include the realization of devices that meet the aforementioned properties. In embodiments, a semiconductor material is electrically addressed using a first and a second electrode. In embodiments, the semiconductor material is a p-type semiconductor comprising semiconductor nanocrystals, wherein the mobility of electrons in the semiconductor material is greater than or equal to the mobility of holes. In embodiments, a device, comprising a first and a second electrode, as well as a semiconductor material comprising semiconductor nanocrystals, provides for the sensitive detection of light, including a combination of high external quantum efficiency, low dark current, and video-frame-rate-compatible temporal response. In embodiments, the device may further provide gain, wherein more than one electron of current flows per second for every photon per second of illuminating light. In embodiments, a device, comprising a first and a second electrode, as well as a semiconductor material comprising semiconductor nanocrystals, provide efficient conversion of optical power into electrical power.

Materials from which the semiconductor nanocrystals of an embodiment are made may include one or more of the following, but the embodiment is not so limited: PbS; PbSe; PbTe; CdS; CdSe; CdTe; SnS; SnSe; SnTe; Si; GaAs; Bi2S3; Bi2Se3; CuInS2; CuInSe2; Cu(InGa)Se2 (CIGS); CuGaSe2.

Materials incorporated into the organic component of the film of an embodiment may include one or more of the following, but the embodiment is not so limited: Benzenedithiol; Dibenzenedithiol; Mercaptopropionic acid; Mercaptobenzoic acid; Pyridine; Pyrimidine; Pyrazine; Pyridazine; Dicarboxybenzene; Benzenediamine; Dibenzenediamine.

In the following description, numerous specific details are introduced to provide a thorough understanding of, and enabling description for, embodiments of the invention. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments.

Schottky-Quantum Dot Photovoltaics for Infrared Power Conversion

The embodiments described herein provide planar, stackable PbS nanocrystal quantum dot photovoltaic devices with infrared power conversion efficiencies up to 4.2%. This represents a three-fold improvement over the previous efficiencies obtained in the more complicated, stacking-incompatible nanoporous architecture. The planar Schottky photovoltaic devices described herein were prepared from solution-processed PbS nanocrystal quantum dot films with aluminum and indium tin oxide contacts. These devices exhibited up to 4.2% infrared power conversion efficiency, which is an approximate three-fold improvement over previous results, and solar power conversion efficiency reached 1.8%. The architecture of the devices described herein allows for direct implementation in multi junction photovoltaic device configurations.

Current-voltage characteristics of the devices of an embodiment were measured in air with an Agilent 4155C Semiconductor Parameter Analyzer. Diode lasers operating at 975 and 1550 nm were used for monochromatic illumination, while solar illumination at AM1.5 conditions was simulated with an Oriel solar simulator (Xe lamp with filters). The source intensities were measured with a Melles-Griot thermopile power meter (calibration uniform within ±5% from 300 to 2000 nm), through a circular 3.1 mm$^2$ aperture at the position of the sample. The external quantum efficiency (EQE) spectra were measured with a Keithley 6430 Source-Measure Unit in current sensing mode, while illumination was provided by a white light source dispersed by a Jobin-Yvon Triax 320 monochromator.

Nanocrystal films were spin-coated in an inert atmosphere onto indium tin oxide (ITO)-coated glass substrates from a 150 mg mL$^{-1}$ octane solution to produce films between 100 and 300 nm thick. The Schottky contact was fanned using a stack of 0.7 nm LiF/140 nm Al/190 nm Ag deposited by thermal evaporation through a shadow mask; all devices had a top contact area of 3.1 mm$^2$. Photocurrents were seen to scale with device area up to 7.1 mm$^2$, and negligible photocurrents were observed when the contacts were illuminated from the metallized side.

FIG. 1A shows the device architecture comprising Aluminum (Al) on a PbS nanocrystal (NC) film (the inset shows a SEM of the nanocrystal film), under an embodiment. The device comprises a first electrode that is the transparent conducting ITO contact. The device further comprises a second electrode that includes the Al. The device includes a semiconductor layer positioned between the first and second electrodes. The semiconductor layer of an embodiment includes colloidal quantum dots (CQDs) passivated with organic ligands, such as PbS CQDs passivated with butylamine, or passivated with benzenedithiol. Spin-coating the nanocrystals from octane solutions led to smooth, densely-packed arrays, as shown by the scanning electron micrograph (SEM) of the inset (scale bar is 20 nm).

Figure 1B:
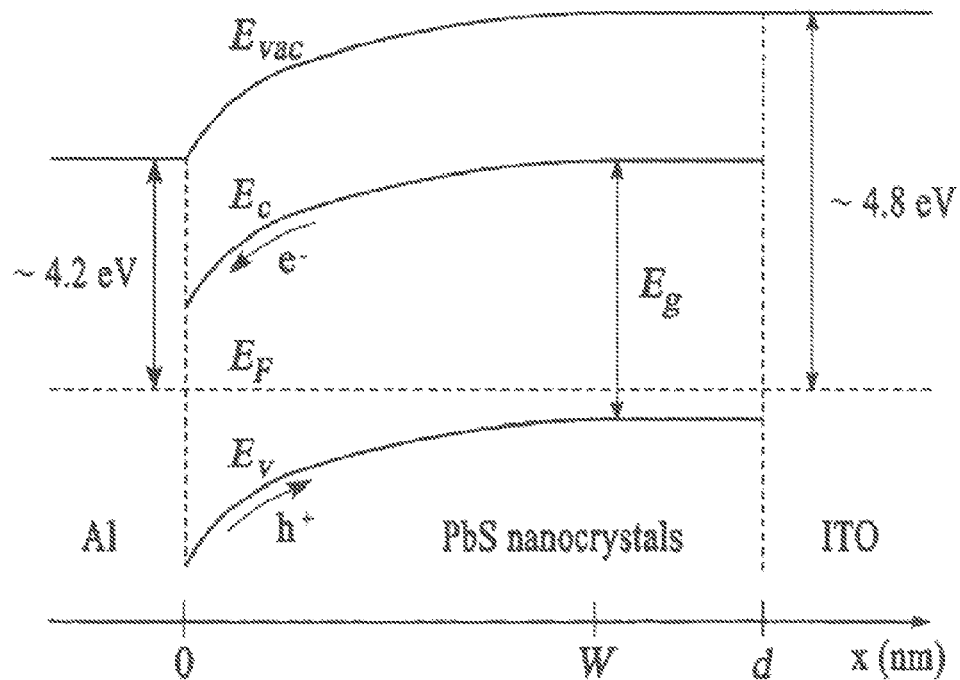
FIG. 1B shows the energy band model of the device, under an embodiment.

FIG. 1B shows the energy band model of the device, under an embodiment. A Schottky barrier was formed at the junction between thermally deposited Al and the ptype PbS colloidal nanocrystal film, and was the electron-extracting contact. Photogenerated holes were extracted through the transparent conducting ITO contact. The energy band model illustrates the presence of bending in the conduction band ($E_c$), valence hand ($E_v$), and vacuum energy ($E_{vac}$) near the Al/nanocrystal interface, under an embodiment. Photogenerated electron ($e^-$) and hole ($h^+$) transport is governed by the presence of a built-in electric field within the depletion layer (of width W) of the nanocrystal layer (of thickness d). The Fermi level ($E_F$) is drawn to show the p-type conduction characteristics. The bandgap ($E_g$) of these nanocrystals is approximately 0.75 eV, defined by the first maximum in the absorption spectrum.

Figure 2:
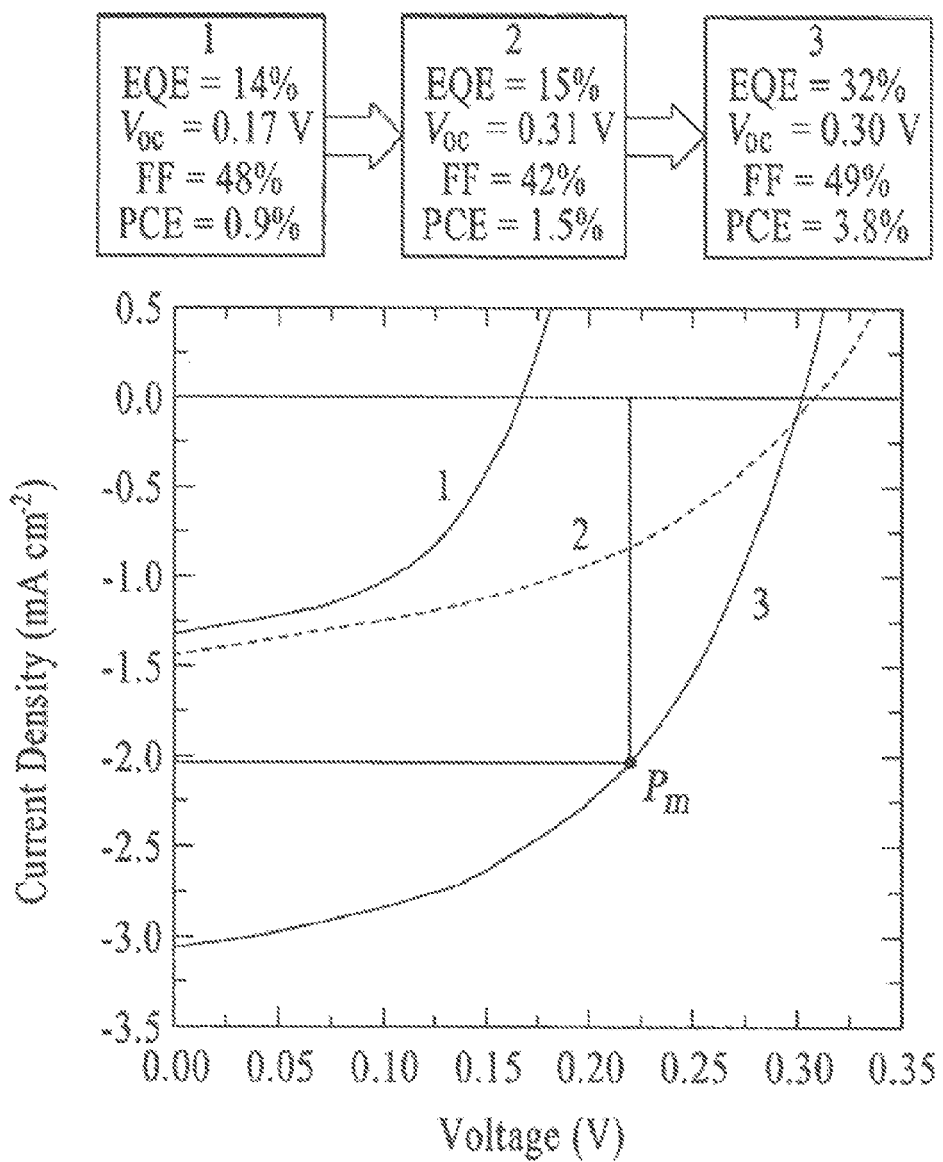
FIG. 2 shows the current-voltage curve and photovoltaic performance (under 975 nm, 12 mW cm$^{-2}$ illumination) for a device, under an embodiment.

Through optimization of the material processing steps, the photovoltaic performance of this structure was improved. The PbS nanocrystals were synthesized using an organometallic route and ligand-exchanged to n-butylamine as described previously. FIG. 2 shows the current-voltage curve and photovoltaic performance (under 975 nm, 12 mW cm$^{-2}$ illumination) for a device processed using the optimized passivation (curve 2) procedure compared to the baseline (curve 1), showing an increase in $V_{oc}$, under an embodiment. Nanocrystals having undergone both the optimized passivation and ligand exchange procedures (curve 3) yielded devices with enhanced $V_{oc}$ and EQE compared to the baseline; this is emphasized by the enclosure that represents the maximum power ($P_m$) load conditions. Fill factor is represented as "FF" and power conversion efficiency is represented as "PCE".

Device open-circuit voltage ($V_{oc}$) was increased by a factor of two without lowering EQE by increasing the cooling rate of the nanocrystals with an ice bath immediately following the growth stage. This performance enhancement was attributed to improved nanocrystal passivation and hence a lower density of trap states in the semiconductor near the metal interface, which are known to affect Schottky devices. To further improve the quality of the nanocrystal/Al junction, a thin LiF layer was evaporated atop the nanocrystal surface prior to Al deposition.

As synthesized, the nanocrystals were passivated with ~2.5 nm long oleate ligands. These long ligands prevent close nanocrystal packing and therefore impede charge transport in films. Many of the long oleate ligands were removed via repeated precipitations using methanol; a single precipitation was used for the baseline device. To fill any empty coordination sites and further displace oleate ligands from the surface, the process of an embodiment included a solution-phase ligand exchange to the ~0.6 nm long n-butylamine ligand. Nuclear magnetic resonance spectroscopy confirmed an increase in the extent of ligand exchange increased with the number of methanol precipitations; three methanol-induced precipitations proved to be an optimal compromise between charge transport efficiency and colloidal stability. This solution-phase approach, in contrast with solid state ligand exchanges, enabled the spin-coating of smooth, crack-free films necessary for high-yield, large-area devices.

When coupled with the optimized passivation described above the exchange enhancement resulted in a four-fold increase in power conversion efficiency. The photovoltaic performance of a representative device that has undergone this series of procedures is shown in FIG. 2 described above.

These optimizations allowed the fabrication of a variety of highly efficient solution-processed photovoltaic cells. A first cell configuration of an embodiment used 230 nm thick layers of PbS nanocrystals with a first excitonic transition at 1650 nm, which is close to the optimal infrared band gap (1750 nm) in a triple junction cell. A second cell configuration of an embodiment provided maximum power conversion at 1550 nm, using smaller nanocrystals (with enhanced absorption at this wavelength) in slightly thicker films (250 nm).

Figure 3A:
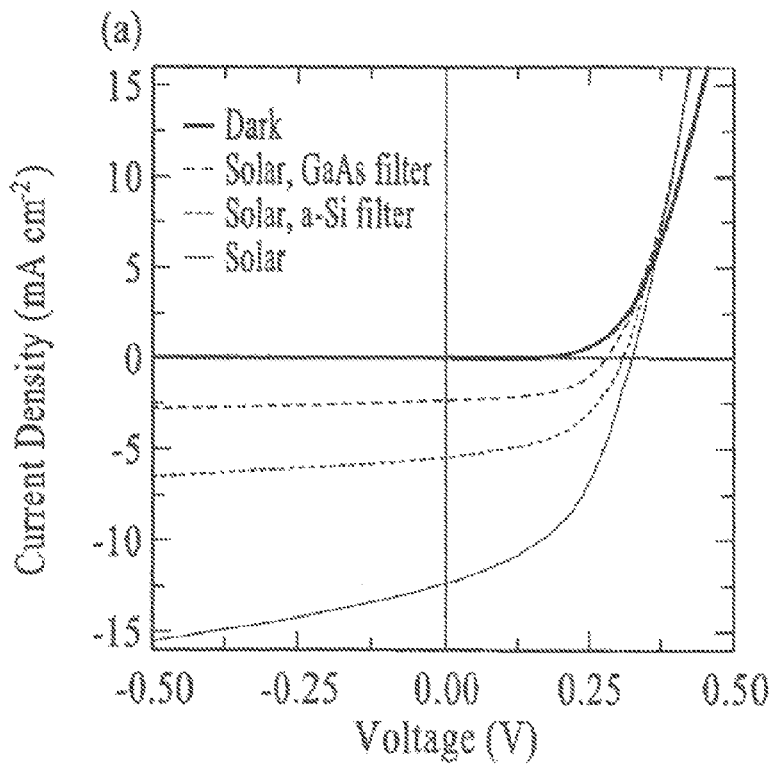
FIG. 3A is a comparison of the current-voltage characteristics for a first cell configuration in the dark and under illumination from variations of the simulated solar illumination source, under an embodiment.
Figure 3B:
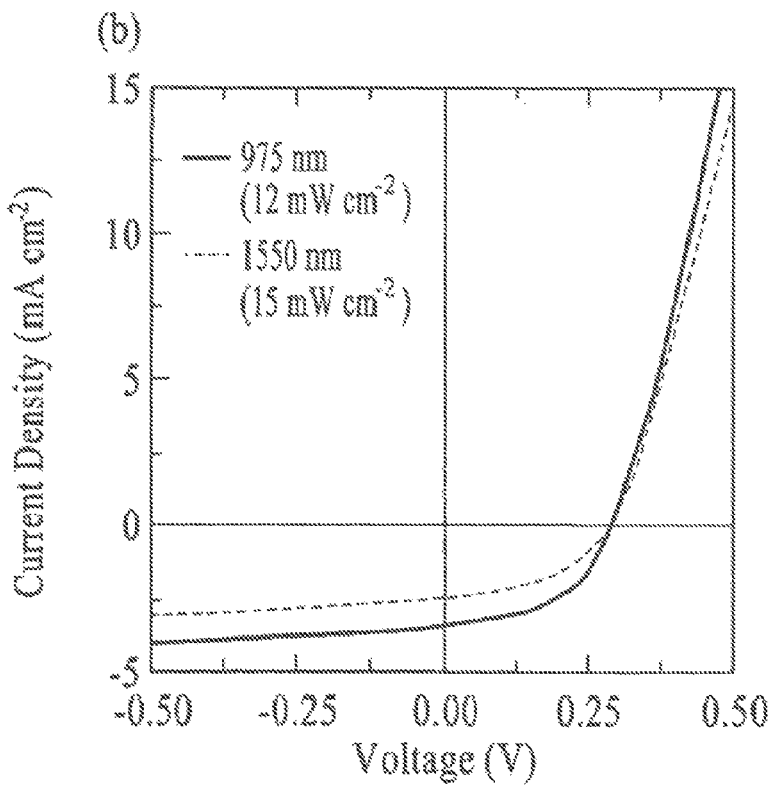
FIG. 3B is a comparison of current-voltage curves for a first cell configuration (under 975 nm illumination) and a second cell configuration (under 1550 nm illumination), under an embodiment.
Figures 3C, 4:
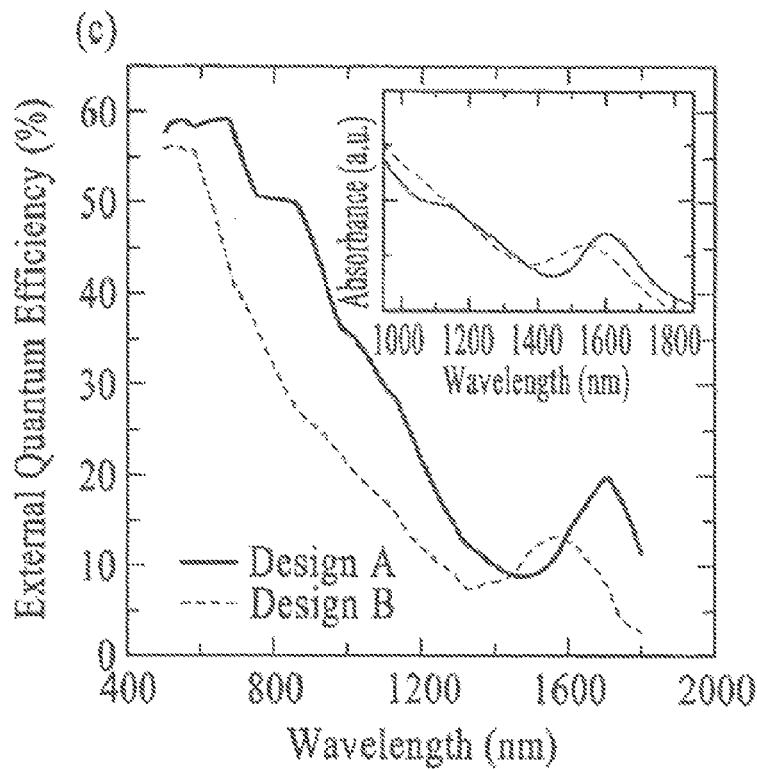
FIG. 3C shows EQE spectra for a first cell configuration and a second cell configuration, under an embodiment.
FIG. 4 shows a summary of the photovoltaic device performance parameters obtained from the various devices, under an embodiment.

FIG. 3A is a comparison of the current-voltage characteristics for a first cell configuration in the dark and under illumination from variations of the simulated solar illumination source, under an embodiment. FIG. 3B is a comparison of current-voltage curves for a first cell configuration (under 975 nm illumination) and a second cell configuration (under 1550 nm illumination), under an embodiment. FIG. 3C shows EQE spectra for a first cell configuration and a second cell configuration, under an embodiment. The inset shows the absorption spectra of the ligand-exchanged nanocrystals in solution; excitonic peaks were also visible in the film absorption spectra. au, arbitrary units.

As stand-alone cells, cells of the first cell configuration yielded a maximum power conversion efficiency of 1.8% under simulated solar illumination at 100 m W cm$^{-2}$. These devices showed up to 4.2% efficiency under monochromatic 975 nm illumination at 12 mW cm$^{-2}$. To demonstrate the capabilities of infrared power conversion and to simulate the conditions within multijunction cells, the simulated solar source was filtered using amorphous Si (a-Si) and GaAs. The a-Si sample transmitted wavelengths longer than 640 nm to produce an infrared intensity of 44 mW cm$^{-2}$ incident on the device. The device converted the resultant transmitted broadband power with 1.8% efficiency. The GaAs filter transmitted 25 mW cm$^{-2}$ at wavelengths longer than 910 nm onto the device; the measured near infrared power conversion was then 1.3%. This suggests that these photovoltaic cells could be directly stacked with other solution-processed cells to achieve efficiencies beyond the 6% mark.

Monochromatic power conversion efficiencies of up to 2.1% were obtained with cells of the second cell configuration using a 1550 nm illumination source. This wavelength is appealing for wireless power distribution applications. The power conversion remained close to 2% even above 100 mW cm$^{-2}$ illumination, which is promising for the high intensities required in thermophotovoltaic systems.

FIG. 4 shows a summary of the photovoltaic device performance parameters obtained from the various devices, under an embodiment. While the $V_{oc}$ values are not large in absolute terms, they are high as a fraction of the material bandgap. Device performance was maintained for up to 5 hours in air but degraded completely over 24 hours. Nanocrystal films were stable in an inert environment for long durations (seven days), which indicates that encapsulation could improve long-term stability. Short-circuit current density is represented as "$J_{sc}$", and power conversion efficiency is represented as "PCE".

The EQE spectrum of devices was measured by illuminating the devices with monochromatic light, measuring the current under short-circuit conditions, and scaling them with respect to the previously indicated EQEs measured at 975 nm and 1550 nm (for the first and second cell configurations, respectively). The EQE spectra for devices of both designs are shown in FIG. 3C. The features of the colloidal nanocrystal absorption spectrum (inset) are manifest in the EQE spectra wherein a well-defined first excitonic transition is retained even in densely-packed, conductive films. The EQE reached values near 60% for visible wavelengths. Film absorption data was also acquired by measuring the fraction of light reflected through the substrate and correcting for ITO and Al absorption. The film absorptions at 975 nm and 1550 nm were 41% and 14%, respectively, which indicates that the internal quantum efficiency exceeded 90% for the best devices.

Efficient, Stable Infrared Photovoltaics Based on Solution-Cast Colloidal Quantum Dots The embodiments described below provide efficient solar cells (e.g., 3.6% power conversion efficiency) operating in the infrared to evince multi-week stability. Since ligands previously employed in record-setting solar cells are labile and reactive with adjacent metal contacts, militating against long-lived device efficiency, a strongly-binding end functional group was selected to passivate the nanoparticle surfaces robustly in the solid state of an embodiment, while avoiding reactivity with the adjacent metal contact. A further increase in proximity among the nanoparticles could be achieved, and could result in improved electron and hole transport, without sacrificing the highly desired quantum size-effect tuning offered by the use of colloidal quantum dots, so the devices described herein comprise a short bidentate linker having a conjugated, instead of an entirely insulating, moiety lying between the end groups. Because a large a change in film volume resulting from the exchange of longer oleic-acid-capped ligands to short crosslinkers would lead to poor film morphology and electrical shorts, solution-exchange to a shorter linker was used in an embodiment prior to film formation and film crosslinking. These considerations, taken together, led to use of a solution-phase exchange to an intermediate ligand, octylamine, followed by solution-casting of films, and finished with a treatment using the bidentate linker, benzenedithiol.

In contrast, the PbSe CQD based photovoltaic device of an embodiment achieves 3.6% infrared power conversion efficiency (PCE). This appears to be the first PbSe colloidal quantum photovoltaic to exceed one percent infrared PCE. It also represents the first solution-processed infrared photovoltaic device to be stable over weeks without requiring fresh deposition of its top electrical contact. Thus, the devices described herein appear to be the first to manifest, and indeed exploit, a very surprising feature—the diffusion of charge carriers, within a colloidal quantum dot solid, over hundreds of nanometers.

Figure 5A:
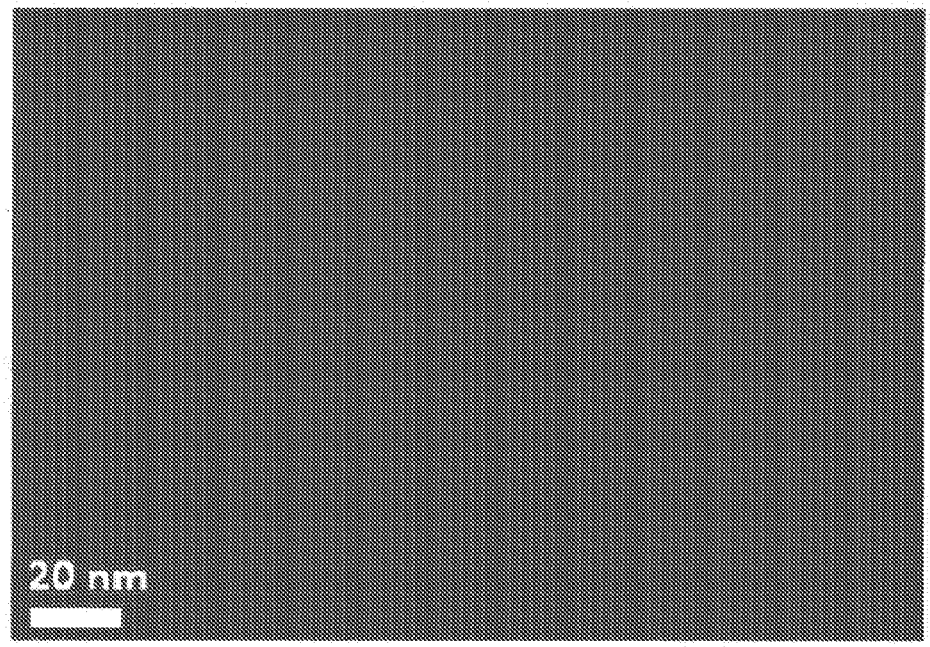
FIG. 5A shows Transmission Electron Microscopy of as-synthesized oleic-acid capped PbSe Nes (diameter approximately 5 nm), under an embodiment.
Figure 5B:
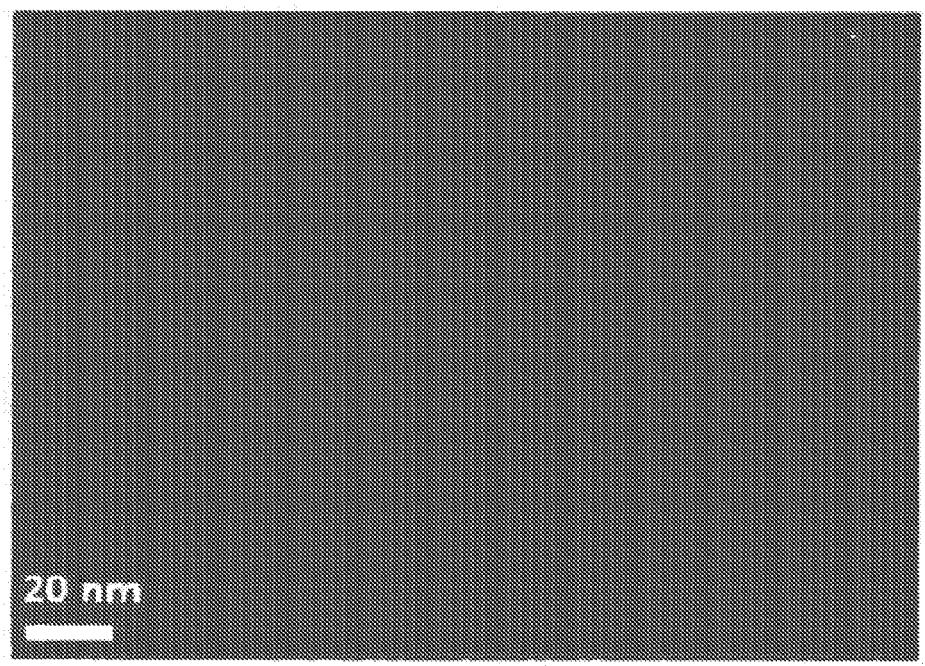
FIG. 5B shows Transmission Electron Microscopy of PbSe Nes following octylamine ligand exchange (the inter-nanoparticle distance was reduced), under an embodiment.
Figure 5C:
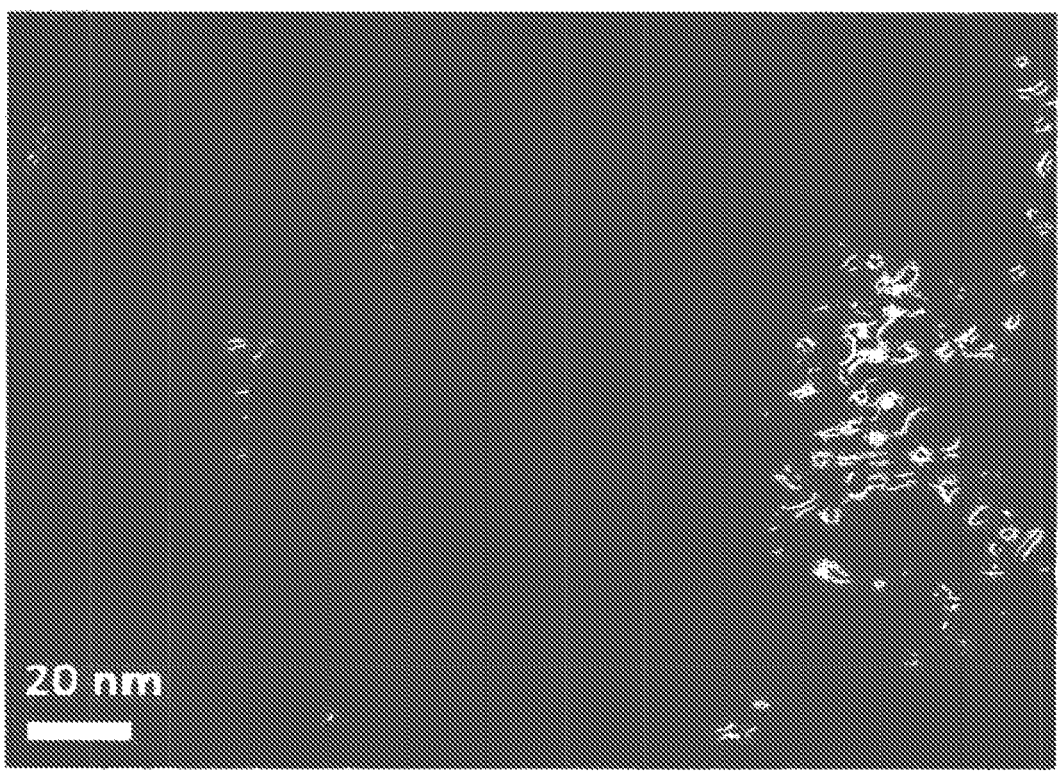
FIG. 5C shows Transmission Electron Microscopy of networks of PbSe NCs after benzenedithiol treatment due to the strong affinity of the thiol-end groups for the Pb atoms, under an embodiment.

The PbSe NCs of an embodiment are synthesized using a modified version of the organometallic route reported for PbS NCs. FIG. 5A shows Transmission Electron Microscopy of as-synthesized oleic-acid capped PbSe NCs (diameter approximately 5 nm), under an embodiment. The as-synthesized NCs were capped with approximately 2 nm oleate ligands, previously reported to impede efficient charge transport in films. The benzenedithiol crosslinking was preceded with a solution-phase ligand exchange. As a result, the oleate ligands were replaced with shorter octylamine ligands (~1 nm). FIG. 5B shows Transmission Electron Microscopy of PbSe NCs following octylamine ligand exchange (the internanoparticle distance was reduced), under an embodiment. FIG. 5C shows Transmission Electron Microscopy of networks of PbSe NCs after benzenedithiol treatment due to the strong affinity of the thiol-end groups for the Pb atoms, under an embodiment.

Regarding the benzenedithiol crosslinking, the crosslinking process performed on the CQD films of an embodiment was optimized by varying the treatment durations through a 1,4-Benzenedithiol treatment optimization. After exposing the NC layers to BDT, films were blow dried with nitrogen and subjected to 30 min vacuum drying. The crosslinking treatment was further optimized by varying its duration time for each of the two layers. Typically, a 20 min treatment time was used for both layers; however, devices where the first layer was treated for shorter durations (~10 min) while the second one for longer (~30 min) recorded the highest external quantum efficiencies, reaching 46% and monochromatic power conversion efficiencies of more than 3.6% under 12 mW cm$^{-2}$ at 975 nm. The reduced treatment time for the first layer enabled realization of smoother and defect-free films. In addition, the fill factor and the open circuit voltage both degraded when the first layer was subjected to more than 15 min treatment time. The later fact correlates with the reduction of the shunt resistance of the device, i.e. pinholes due to the chemical processing are significant.

Figure 6:
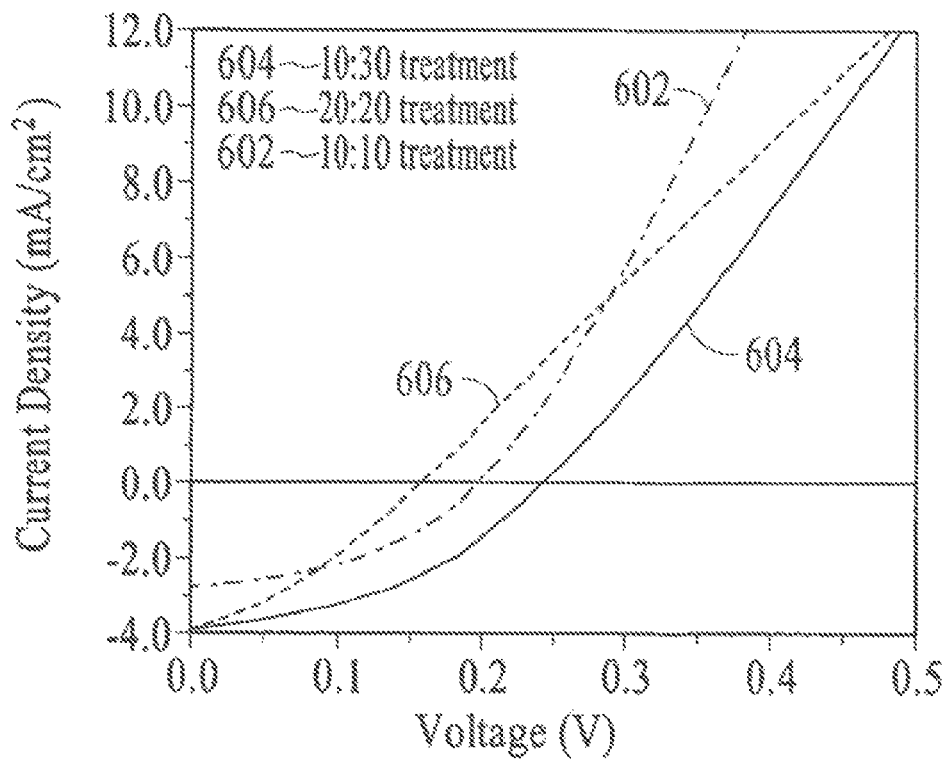
FIG. 6 shows the performance of three differently processed PbSe CQD devices, two of which exhibited similar external quantum efficiencies, under an embodiment.

FIG. 6 shows the performance of three differently processed PbSe CQD devices, two of which exhibited similar external quantum efficiencies, under an embodiment. The best passivated device 604 exhibits an IR PCE of 3.65% with 40% fill factor. The fill factor decreases to 34% when the treatment duration of the first layer 606 is increased. The highest fill factor (45%) is registered for a reduced treatment time for both layers 602. The device with 20 min treatment duration for both layers 606 was deeply affected by processing defects because it exhibited the lowest open circuit voltage ($V_{oc}$) and fill factor. Optimization of the treatment duration was therefore essential to maximizing the transport properties and thus the performance while minimizing pinholes. FIG. 6 also shows the best performance of an under-treated device 602 which had a better fill factor resulting from minimal defects but was not as efficient as the best passivated devices 604. FIG. 7 summarizes the best performances of differently processed devices recorded under 12 mW cm$^{-2}$ illumination at 975 nm, under an embodiment.

Figure 5D:
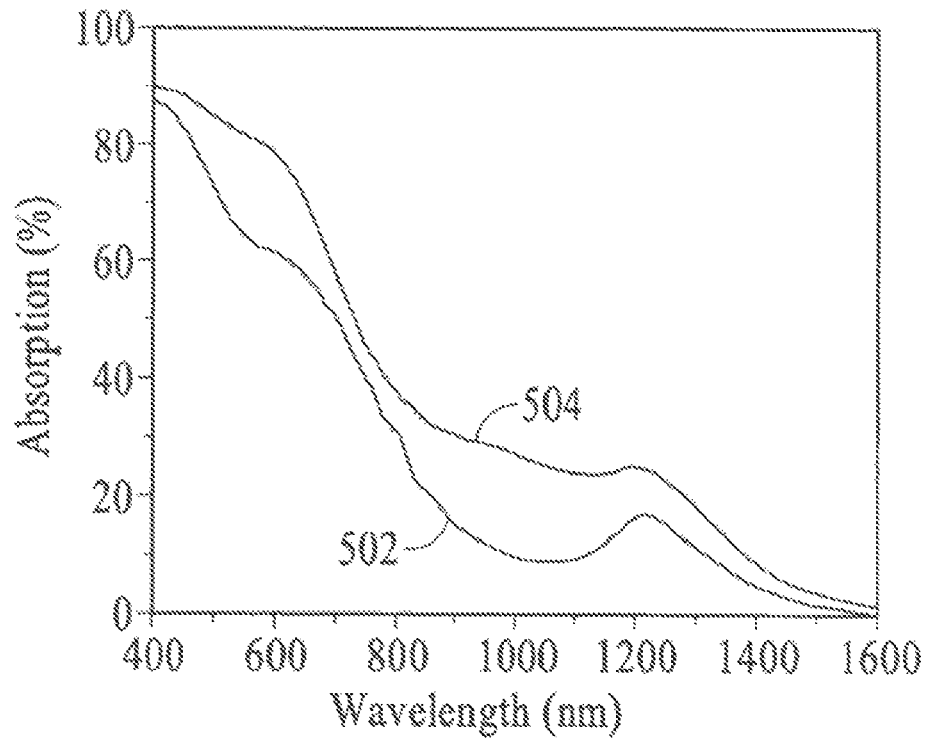
FIG. 5D shows absorption of single treated (red) and double treated (blue) layers of PbSe NCs, under an embodiment.

The embodiments herein used PbSe NCs having an absorption peak ranging between 1200 and 1300 nm. FIG. 5D shows absorption of single treated 502 and double treated 504 layers of PbSe NCs, under an embodiment. Thin NC films (~110 nm) were spin-coated on ITO substrates and the samples were immersed in a dilute solution of benzenedithiol in acetonitrile (3.5 mM) for a duration ranging from 10 to 30 minutes. This rendered the layer insoluble in the nonpolar solvents that were used for spin-coating the NCs. A second thin layer was deposited on top to ensure the formation of a smooth, densely packed film. The second layer was also subjected to a linking treatment. The total thickness of the NCs active layer ranged between 210 and 250 nm.

Figure 8A:
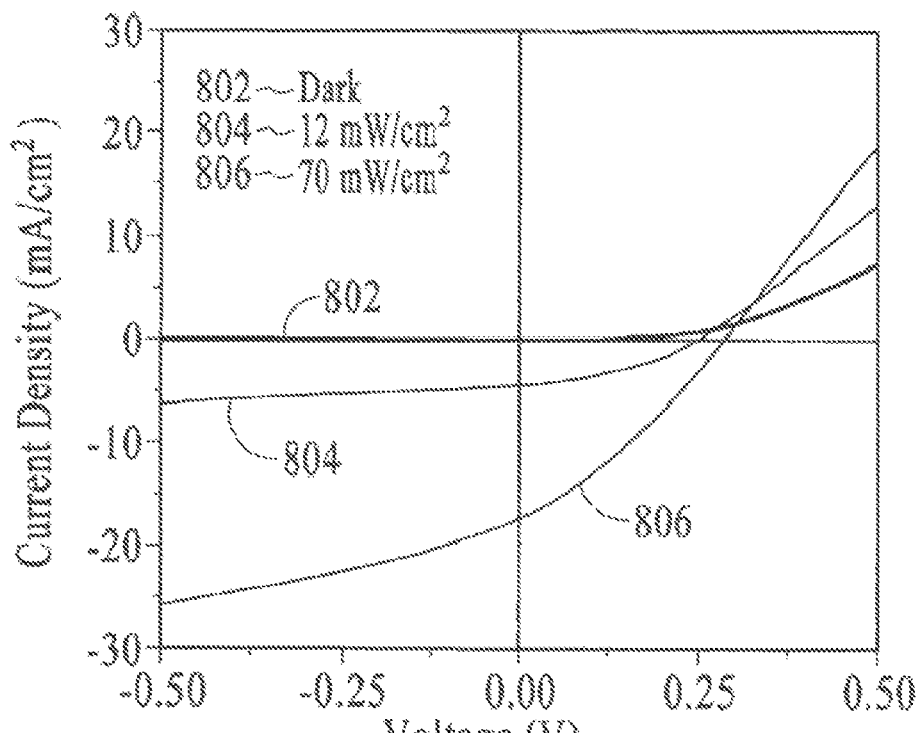
FIG. 8A shows photovoltaic device performance, specifically current-voltage characteristics of a benzenedithiol treated two-layered device exhibiting 3.6% monochromatic power conversion efficiency at 975 nm under 12 mW cm$^{-2}$ illumination, under an embodiment.
Figure 8B:
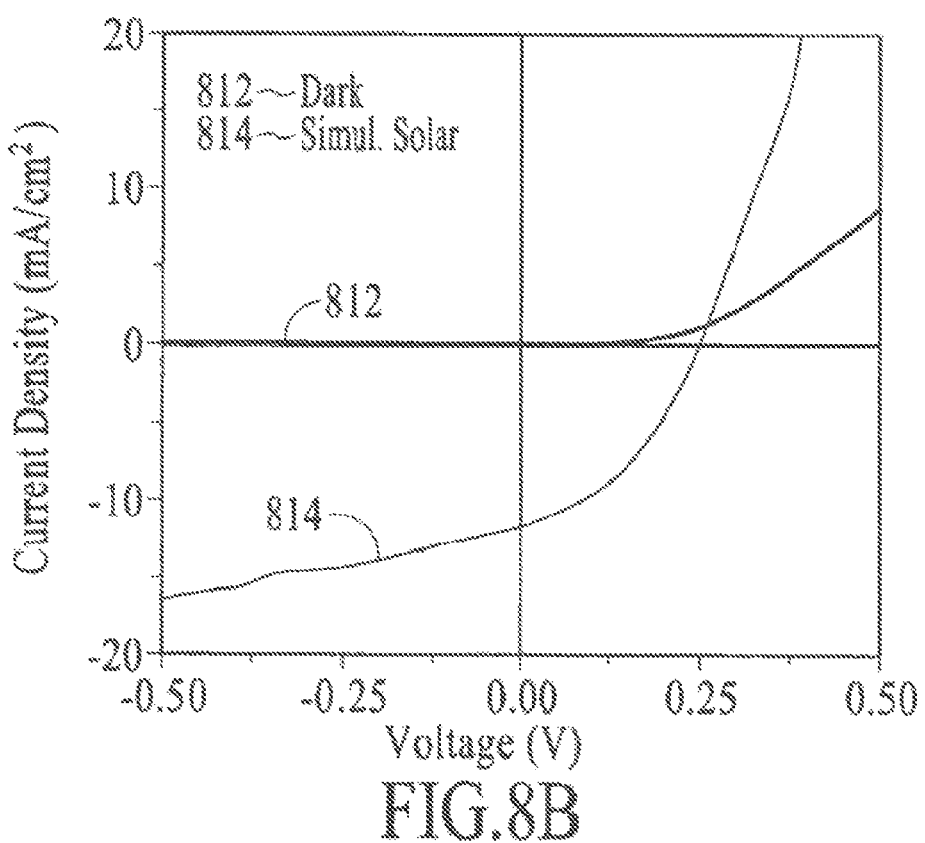
FIG. 8B shows photovoltaic device performance, specifically simulated solar power conversion efficiency of more than 1.1% (i.e. AM1.5 at 100 mW cm$^{-2}$), under an embodiment.

FIG. 8A shows photovoltaic device performance, specifically current-voltage characteristics of a benzenedithiol treated two-layered device exhibiting 3.6% monochromatic power conversion efficiency at 975 nm under 12 mWcm$^{-2}$ illumination, under an embodiment. FIG. 8B shows photovoltaic device performance, specifically simulated solar power conversion efficiency of more than 1.1% (i.e. AM1.5 at 100 mW cm$^{-2}$), under an embodiment. From total absorbance measurements at 975 nm, the IQE was found to approach 90%.

Figure 8C:
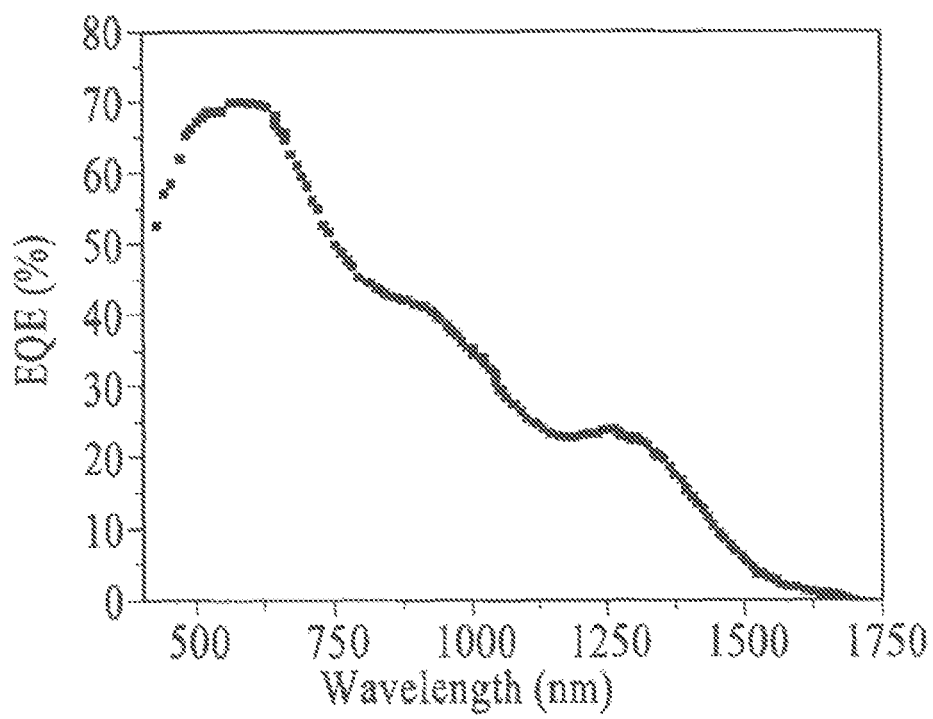
FIG. 8C shows photovoltaic device performance, specifically spectral external quantum efficiency of a device reaching 37% in the infrared and about 70% in the visible range, under an embodiment.

FIG. 8C shows photovoltaic device performance, specifically spectral external quantum efficiency of a device reaching 37% in the infrared and about 70% in the visible range, under an embodiment. The spectrally resolved EQE is presented between 400 to 1600 nm. The EQE follows closely the features of the absorption spectrum shown in FIG. 1D; a well-defined first excitonic peak is observable at 1250 nm. In the visible wavelengths, a peak: EQE of 70% is recorded. From measurements of total film absorbance, the internal quantum efficiency is estimated at 975 nm to approach 90% in the best devices, which implies highly efficient charge separation and extraction. With respect to reproducibility of the results reported herein, throughout the course of this study, approximately 40 devices were made that exhibited infrared monochromatic power conversion efficiencies in excess of 3%.

Figure 8D:
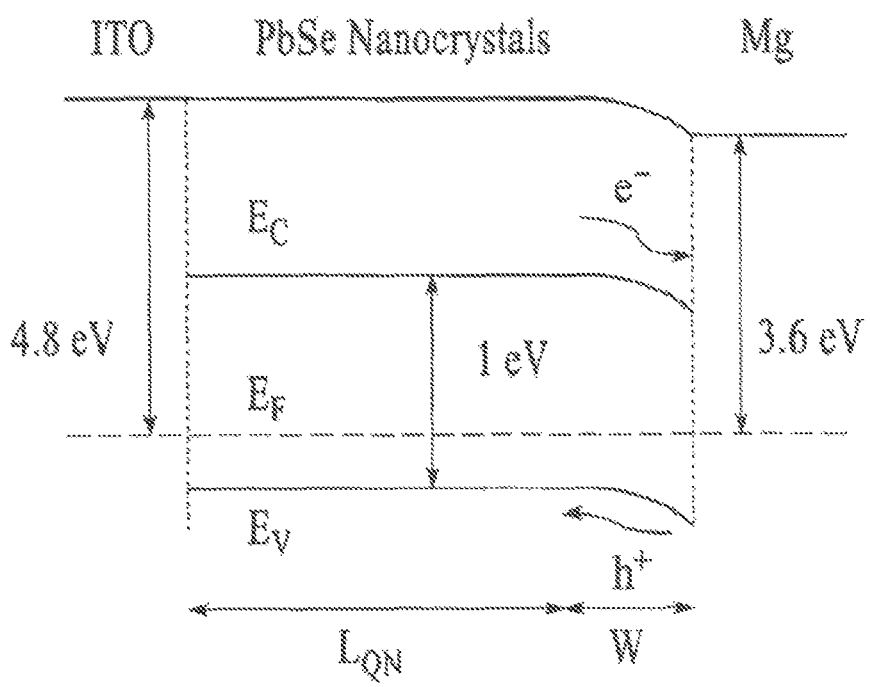
FIG. 8D shows a spatial band diagram showing the device model, under an embodiment.

FIG. 8D shows a spatial band diagram showing the device model, under an embodiment. A Schottky barrier is formed at the Mg/p-type semiconducting NCs interface. The majority of the photogenerated carriers diffuse through the quasi-neutral region ($L_{QN}$-145 nm and are separated in the depletion region (W-65 nm). A fraction of the carriers is lost to recombination.

Figure 9A:
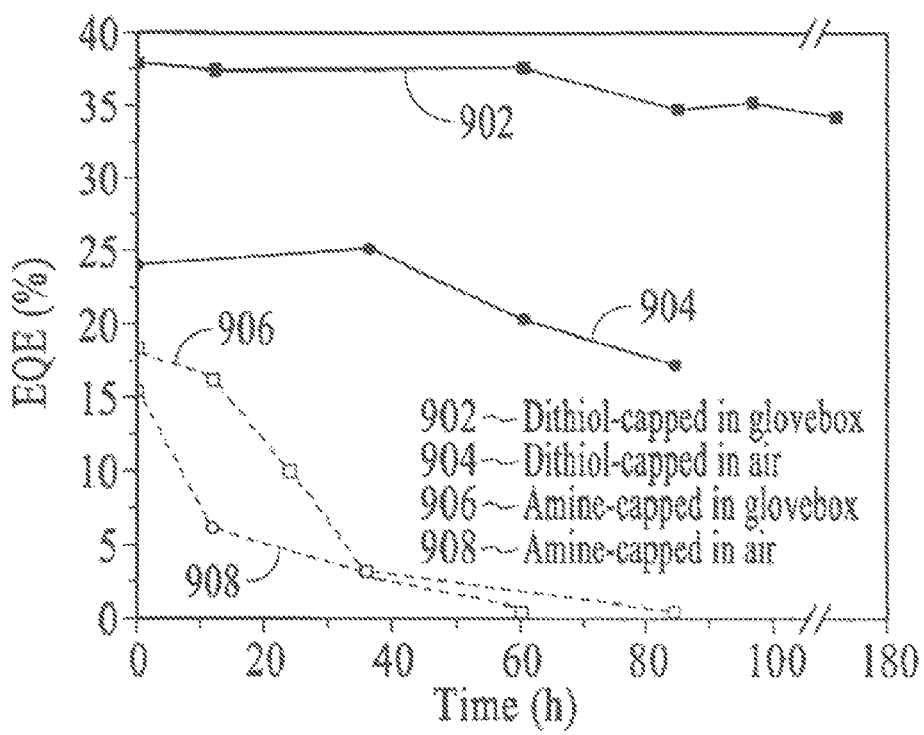
FIG. 9A is a plot of EQE stability comparison of benzenedithiol treated PbSe devices with previously reported amine-capped devices stored in air and in inert atmosphere, under an embodiment.
Figure 9B:
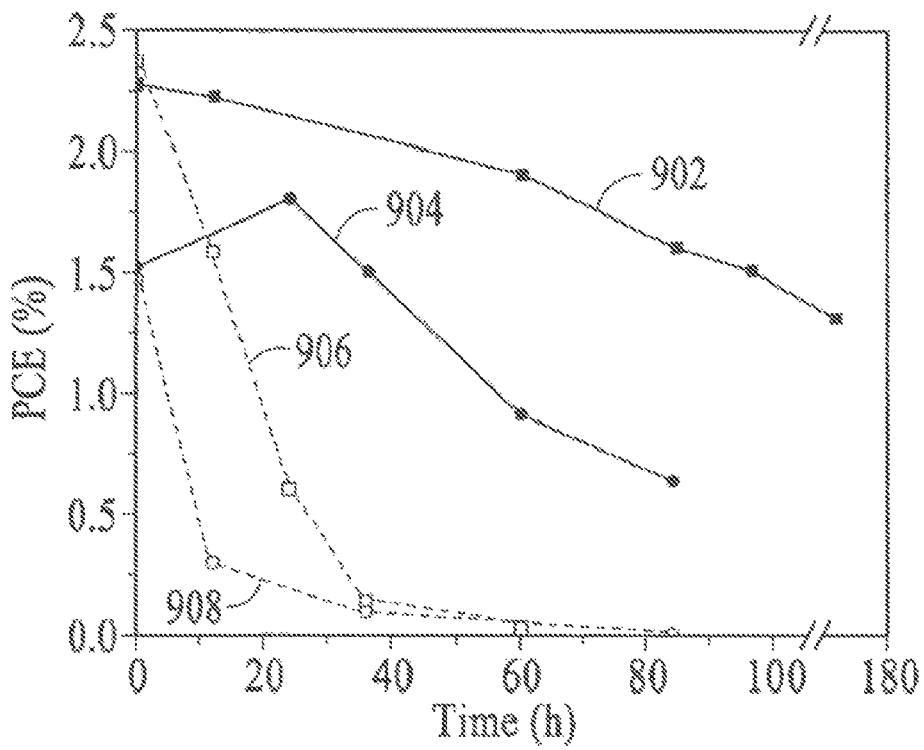
FIG. 9B is a plot of PLE stability comparison of benzenedithiol treated PbSe devices with previously reported amine-capped devices stored in air and in inert atmosphere, under an embodiment.

FIG. 9A is a plot of EQE stability comparison of benzenedithiol treated PbSe devices with previously reported amine-capped devices stored in air and in inert atmosphere, under an embodiment. FIG. 9B is a plot of PCE stability comparison of benzenedithiol treated PbSe devices with previously reported amine-capped devices stored in air and in inert atmosphere, under an embodiment. This data compares the stability of the devices fabricated as described herein with previously reported high-efficiency devices (e.g., devices fabricated by spin-coating butylamine-capped PbS NCs on ITO substrates and evaporating Al contacts on top).

The benzenedithiol-crosslinked PbSe NC devices of an embodiment retained their high EQE values for over ten days when stored in a nitrogen filled glovebox (solid red line), and their PCE maintains 90% of its initial value for more than 2 days. The mine-capped devices (dashed red line) severely deteriorated within the first 24 h (e.g., lost half of their EQE and more than 75% of their power conversion efficiency).

In air, the benzenedithiol treated devices (solid blue lines) registered greater stability than the amine-capped devices (dashed blue lines) (e.g., the dithiol-capped PbSe NC based devices retained their high EQE and ~80% of their PCE over 48 hours, whereas the amine-capped devices lost all performance within the same period of time). Note that all the testing was done in air, and all the devices in this study were exposed to a minimum of 15 hours of oxygen and moisture. Several high efficiency benzenedithiol treated devices retained over 75% of their EQE for more than two weeks. The reported EQE and PCE values were taken under 12 mW cm$^{-2}$ at 975 nm.

The physical mechanisms responsible for the performance of the devices of an embodiment was investigate in order to understand further the process steps that were most critical to the performance improvements noted in the devices. The investigation, described in detail below, began by determining which of the metal-semiconductor junctions is responsible for providing rectification and charge separation. Estimates were made from capacitance-voltage measurements of the spatial extent of the resultant depletion region and, from this, a spatial band diagram was proposed. The absorbance of photons was quantified in each of the key regions (the depletion and quasi-neutral portions) of the colloidal quantum dot active region. Combining this with knowledge of the depth of the depletion region, the thickness of the device, and the measured EQE, estimates were made of the minority carrier diffusion length required to explain the relatively high overall efficiency. An investigation was then carried out as to whether the electronic properties of the materials of an embodiment are indeed capable of supporting such a long minority carrier diffusion length. Electron mobility was measured using the time-of-flight method and the carrier lifetime was estimated using the open-circuit-voltage decay method. In this way an electron diffusion length was estimated in the range 200-300 nm, and this range was found to be sufficient to account for the relatively high observed efficiencies. It was also concluded that further improvement in performance could be achieved by increases in electron mobility leading to even more efficient diffusion from the quasi-neutral region to the edge of the depletion region.

Figure 10A:
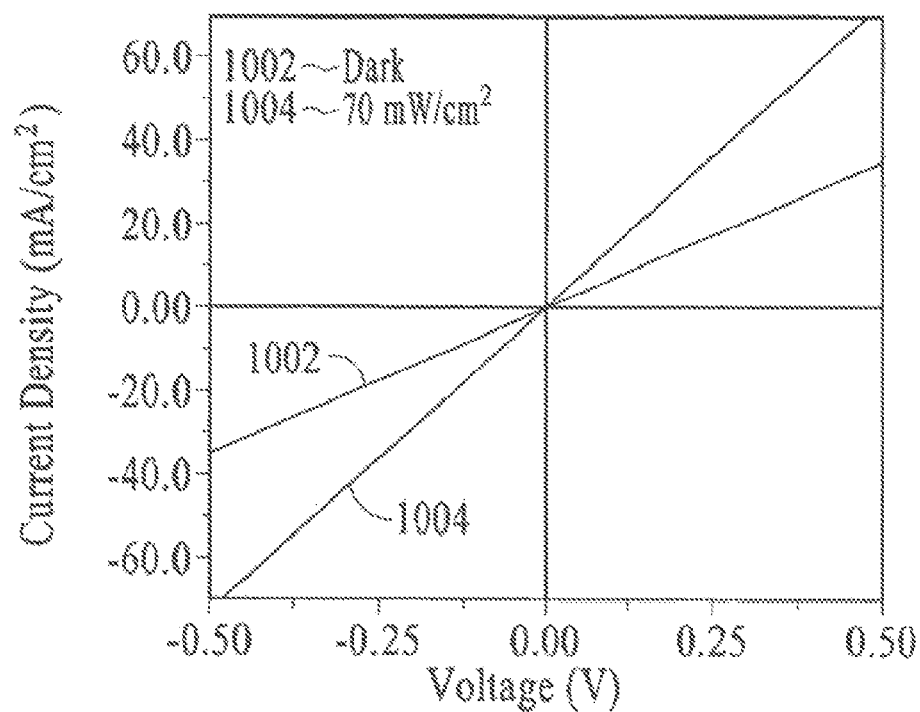
FIG. 10A shows current-voltage characteristics of BDT treated PbSe CQD devices with bottom ITO contact and with Au top contact, under an embodiment.
Figure 10B:
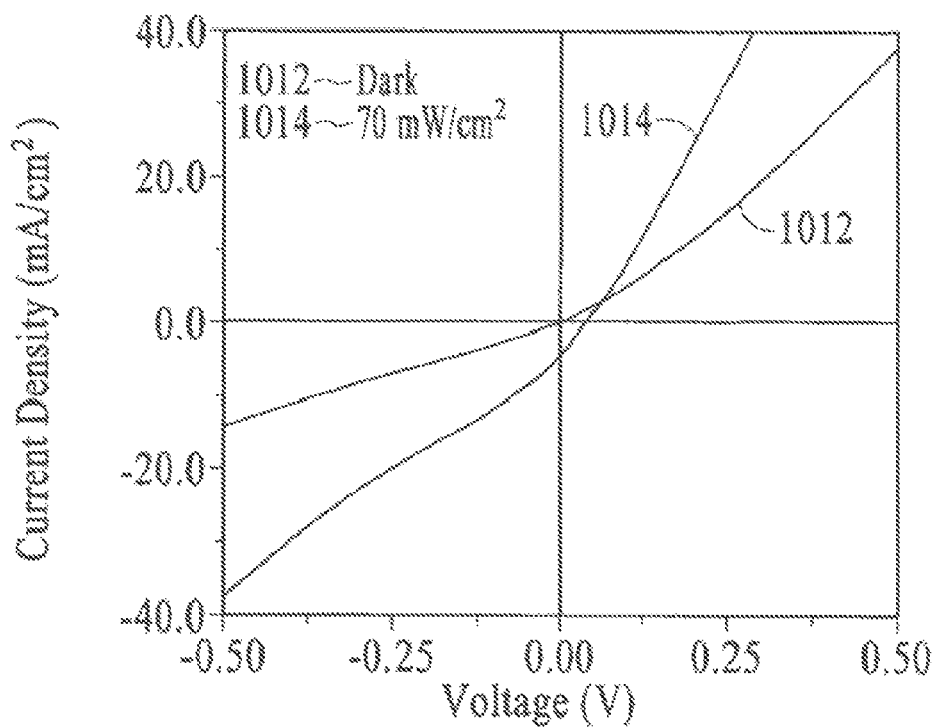
FIG. 10B shows current-voltage characteristics of BDT treated PbSe CQD devices with bottom ITO contact and with Ag top contact, under an embodiment.
Figure 10C:
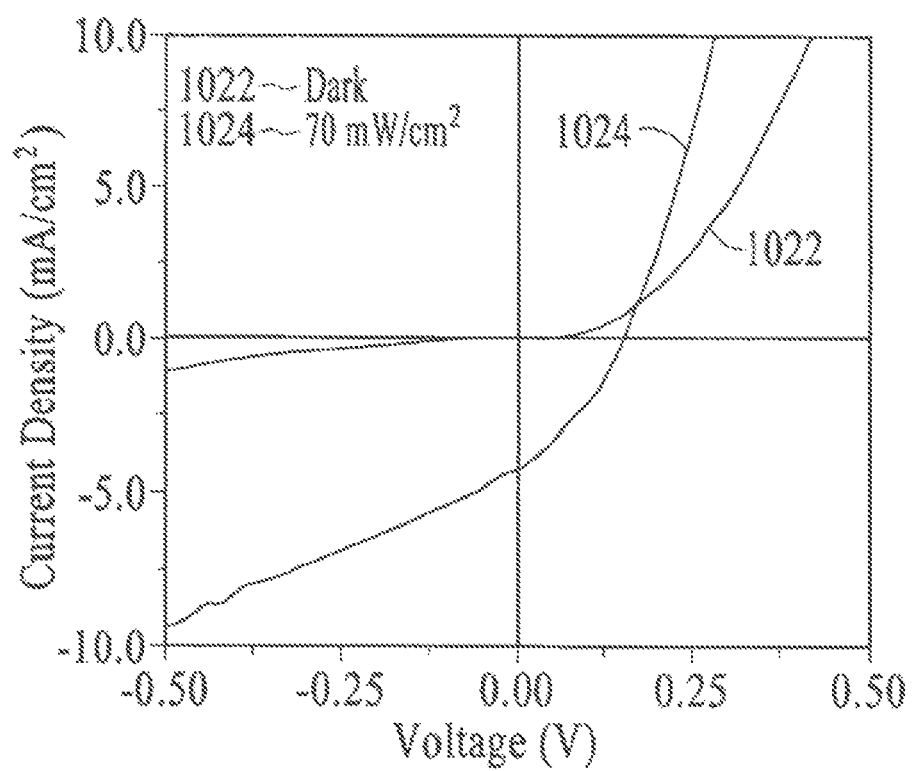
FIG. 10C shows current-voltage characteristics of BDT treated PbSe CQD devices with bottom ITO contact and with Al top contact, under an embodiment.

The location of the rectifying metal-semiconductor junction, and thus the depletion region, in the devices of an embodiment was studied by varying the choice of metal both as bottom and top contact. First, while maintaining ITO as the bottom contact, Al (~4.2 eV), Ag (~4.3 eV), or Mg (~3.6 eV) was deposited atop the NC films. In all cases similar I-V characteristics were obtained, though the open circuit voltages ($V_{OC\_Mg} > V_{OC\_Al} > V_{oc\_Ag}$) were smaller when Ag and Al were used. On the other hand, when Au was employed as the top contact, the device exhibits a linear I-V (see FIG. 10A). From this it was concluded that there exists a depletion region at the Mg—NC junction in the devices. FIG. 10A shows current-voltage characteristics of BDT treated PbSe CQO devices with bottom ITO contact and with Au top contact, under an embodiment. FIG. 10B shows current-voltage characteristics of BDT treated PbSe CQD devices with bottom ITO contact and with Ag top contact, under an embodiment. FIG. 10C shows current-voltage characteristics of BDT treated PbSe CQD devices with bottom ITO contact and with Al top contact, under an embodiment.

The bottom contact was also varied, replacing ITO (~4.8 eV) with Pt (~6.3 eV) or Au (~5 eV). All devices continued to provide good rectification when a Mg top contact was employed; and the current-voltage characteristics did not appreciably change. From this it was concluded that the bottom contact (transparent ITO the devices) serves mainly for ohmic hole collection in the solar cells. The spatial band diagram shown in FIG. 8D is proposed based on these conclusions.

The depth of the depletion region was then determined. The capacitance was measured at zero bias (under short-circuit conditions). The static relative permittivity via the charge extraction was found by linearly increasing voltage (CELIV) method to be 15±1.

Figure 11A:
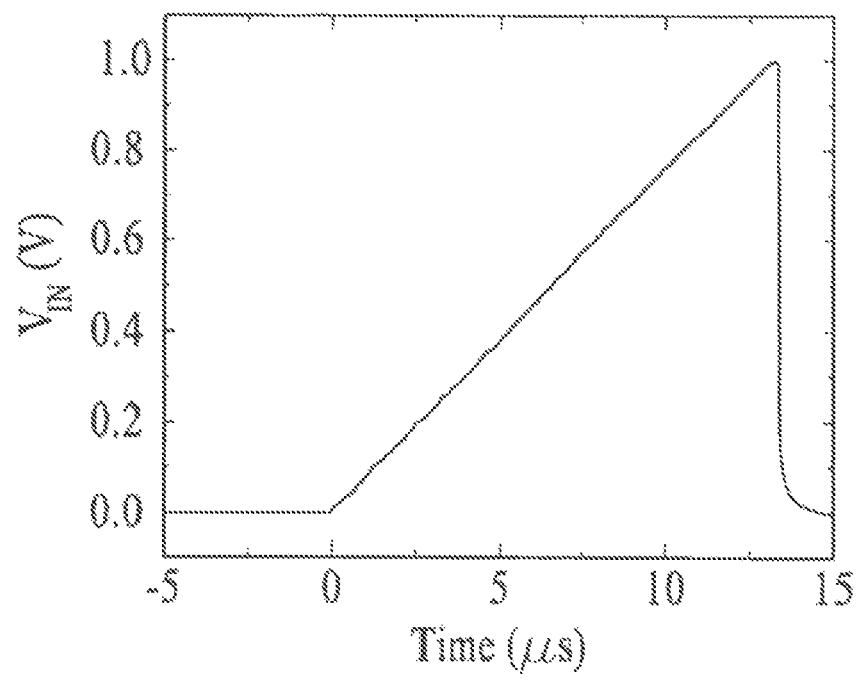
FIG. 11A shows an input pulse of linearly increasing voltage (A=75000 V/s) for typical CELIV transients.
Figure 11B:
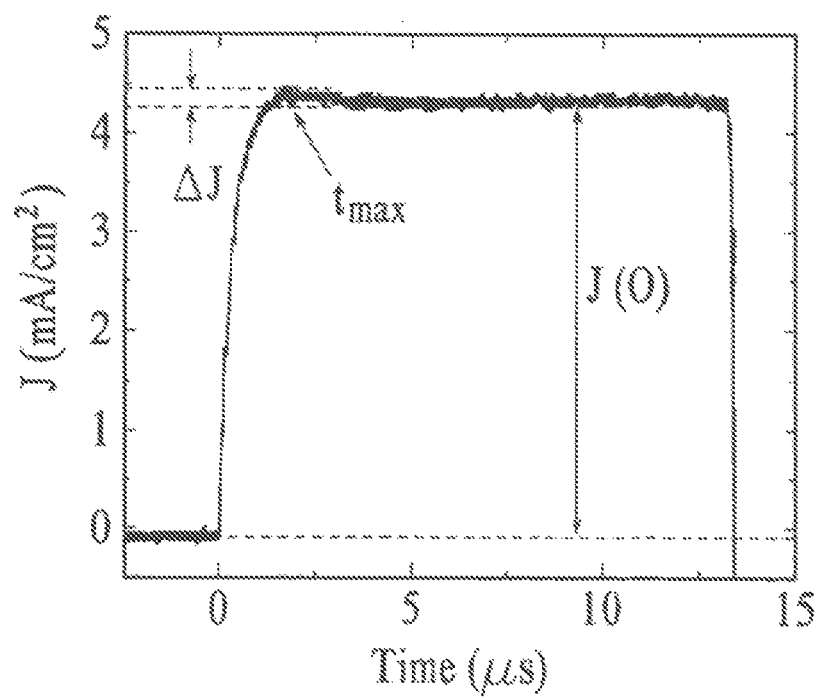
FIG. 11B shows the output current density transient for typical CELIV transients. The hole mobility is determined from $t_{max}$.

The majority carrier mobility in the photovoltaic devices were measured via CELIV, which involves applying a pulse of linearly increasing voltage (U(t)=At, where A is the pulse slope) and measuring the current transient across the sample with at least one blocking contact. Using the CELIV method, the extraction of the equilibrium carriers was investigated. The time to reach the extraction current maximum $t_{max}$ was used to estimate the hole mobility. When $\Delta j = j_{max} - j(0) \leq j(0)$, where $j_{max}$ is the maximum value of the current and j(0) is the displacement current as indicated in FIG. S6, the hole mobility can be calculated from $$t_{max} = d\sqrt{\frac{2}{\mu a'}}$$

where d is the film thickness (~230 nm), and μ is the majority carrier mobility. The mobility was found to be 2.4× 10$^{-3}$ cm$^2$V$^{-1}$s$^{-1}$ in the PbSe NC based solar cells of an embodiment. The displacement current step j(0) can be used to evaluate the static relative permittivity $\in_r$, $j(0) = \in_r \in_0 A/d$ where $\varepsilon_0$ is permittivity of free space. The static relative permittivity was found to be 15±1. A typical CELIV transient is represented in FIG. S6. FIG. 11A shows an input pulse of linearly increasing voltage (A=75000 V/s) for typical CELIV transients. FIG. 11B shows the output current density transient for typical CELIV transients. Hole mobility is determined from $t_{max}$.

This allowed for estimation of the depletion width to be 65±5 nm. The capacitance was measured at zero bias under short circuit conditions in order to determine the device depletion width (W). The capacitance value per unit area ($C_i$) was determined to be $2\times10^{-7}$ F cm$^{-2}$. The depletion width was determined using the following equation $$W=\varepsilon_r\varepsilon_0/C_i$$

where $\varepsilon_0$ is permittivity of free space, and $\varepsilon_r$ is static relative permittivity.

Having elucidated a simple spatial band diagram, efforts turned to determining where electron-hole pairs were generated, and in which quantities, within the two regions of interest—the depletion region, with its charge-separating field, and the quasi-neutral region, in which minority carrier diffusion would serve as the dominant transport mechanism.

The analysis first looked at whether absorption within the depletion region could, on its own, account for the high observed EQEs. From knowledge of the absorption per unit length of 975 nm light, the fraction of incident power absorbed in each region was determined, and is shown in FIG. 12. This led to the conclusion that less than half of the observed short-circuit current is attributable to electron-hole pair generation from absorption within the depletion region.

To account for the EQE observed, it is estimated that two thirds of the electron-hole pairs photogenerated within the quasi-neutral portion of the device have diffused to the depletion region to be efficiently separated therein and extracted therefrom. Such a result would be possible if the minority carrier diffusion length for electrons in the quasi-neutral region were to exceed a few hundred nanometers.

For the total absorption measurements, the reflectivity of the substrate was measured and corrected for the ITO (~5%) and Mg contact absorption (~4%). In the case considered in the following analysis, the percentage of light absorbed at 975 nm was 43% and the corresponding mean external quantum efficiency was 32%. It is assumed that the light absorbed in the photovoltaic devices through the ITO contact was reflected back at the mirror-like upper metallic contact.

Thus, assuming a uniform light absorption profile, the fraction of light absorbed incident from the ITO side in double pass is:

$$A_{total}=1-e^{-2\alpha d}$$

where d is the thickness of the CQD film, and $\alpha$ is the absorbance. The percentage of photons absorbed through the depletion region of 65 nm width near the Mg contact in double-pass is estimated to be 13%. Accordingly, the electron-hole pairs generated in the depletion region, believed to be efficiently extracted (>90%), only contributed to less than half of the photocurrent. The quasi-neutral region absorbed the remaining 30% of the incident light. In order to account for the 32% EQE at 975 nm, 20% of the photogenerated carriers created in the quasi-neutral portion of the device must have diffused to the depletion region to be separated therein. The rest was lost to carrier recombination. Diffusion therefore must be playing a large role in the devices of an embodiment.

FIG. 13 is a schematic diagram of the analytical model used in determining where electron-hole pairs were generated, under an embodiment The electron-hole pairs generated within the depletion region (W) are efficiently separated. The electrons generated within $L_{QN2}$ diffuse to the depletion region where they are separated by the built-in field while the electrons generated within $L_{QN1}$ of the ITO contact are mostly lost to recombination. Assuming that the electron-hole pairs which are nearest to the depletion region have a larger chance to diffuse and separate, the photons absorbed in $L_{QN2}$ of thickness ~95 nm account for the rest of the EQE. In order to estimate the required diffusion length for the least mobile carrier (electrons in this case), it is assumed that only the photogenerated carriers in the quasi-neutral region that have a transit time of $0.1\tau$ in the depletion region ($L_{QN2}$~95 nm) are largely not lost to recombination where $\tau$ is the recombination lifetime. The model is estimated to be plausible within experimental uncertainty if the minority carrier diffusion length is in the 200-300 nm range.

To evaluate the feasibility of the electron and hole drift over the depletion region depth (~65 nm) and the electron minority carrier diffusion over the quasi-neutral region depth (~145 nm), the electron and hole mobilities were measured. When combined with carrier lifetimes, these enable the drift and diffusion lengths to be estimated.

Minority electron carrier mobility was studied using the time-of-flight (TOF) method and the majority carrier mobility via charge extraction by linearly increasing voltage (CELIV). TOF experiments employed a sample with a geometry identical to the photovoltaic device, i.e. a layer of NCs sandwiched between the ITO and magnesium contacts, with the exception that the total NC layer in this case was thicker (>500 nm). The electron mobility was found to be $1.4\times10^{-3}$ cm$^2$V$^{-1}$s$^{-1}$ for a benzenedithiol treated device. CELIV experiments conducted on the photovoltaic devices allowed us to estimate the hole mobility to be $2.4\times10^{-3}$ cm$^2$V$^{-1}$s$^{-1}$ in the dithiol treated NC based devices. Thus, the electron and the hole mobility in the devices of an embodiment are within the same order of magnitude, in contrast with recent findings in PbS colloidal quantum dots devices, where the minority electrons were ~8 times less mobile.

Time of flight (ToF) was performed on a sample with a geometry identical to the photovoltaic device, i.e. a layer of NCs sandwiched between the ITO and magnesium contacts, with the exception that the total NC layer in this case was thicker (>700 nm). The devices were held under reverse bias by applying a positive potential to the Mg contact and a negative potential to the ITO. A 10 ns pulse of 532 nm light was incident on the sample from the transparent ITO side. Under the influence of the applied bias, the photo-generated minority carriers (electrons) drift across the sample to the Mg anode. The transient current generated by the flow of the photocarriers was recorded. In the case of dispersive media such as NCs, the transit time was determined by finding the intersection of two linear regions on a log-log plot of current versus time. FIG. 14 shows a representative ToF transient plot. The intersection of the two linear regions 1402 and 1404 is the transit time $t_1$~1 μs. The sample thickness was 750 nm and the voltage bias was set to 5 V. The transit time is related to the mobility by $\mu=d^2/V.t_r$ where d is the film thickness and V is the applied bias. The minority electron mobility registered two orders of magnitude increase from almost $1\times10^{-5}$ cm$^2$V$^{-1}$s$^{-1}$ for an untreated film to $1.4\times10^{-3}$ cm$^2$V$^{-1}$s$^{-1}$ for a BDT treated film.

Figure 15:
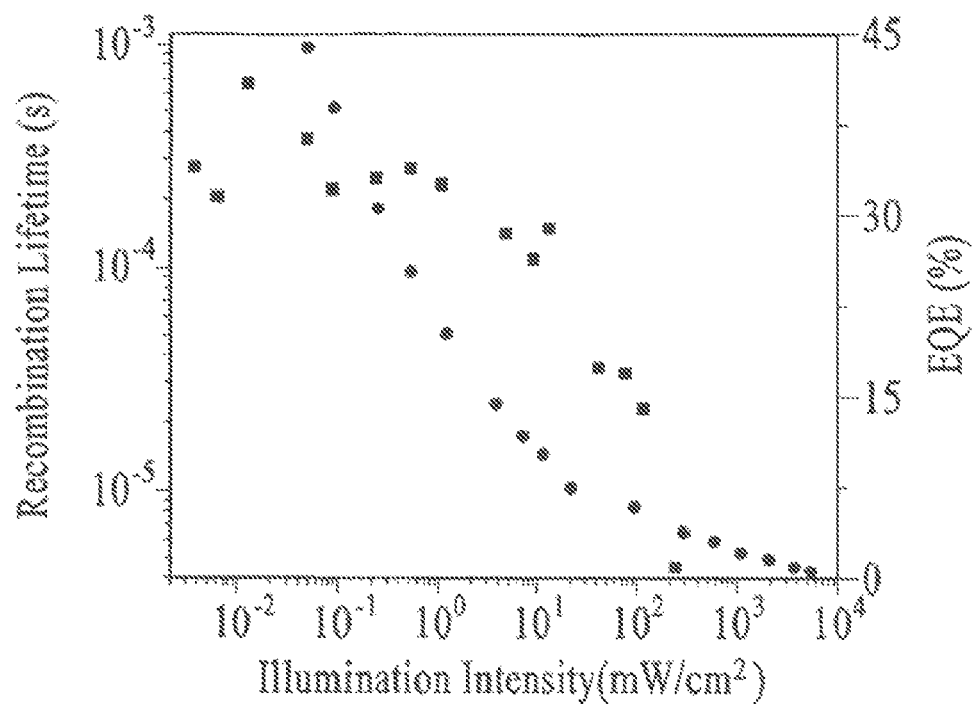
FIG. 15 is a plot of carrier recombination lifetime (blue, left axis) and external quantum efficiency (red, right axis) versus illumination intensity at 975 nm, under an embodiment.

The recombination lifetime $\tau$ was estimated at relevant solar intensities through the technique of transient open circuit voltage decay (OCVD). The device was illuminated using a digitally modulated 975 nm diode laser at different intensities. At 12 mW cm$^{-2}$ the lifetime was found to be on the order of 10-20 µs. FIG. 15 is a plot of carrier recombination lifetime (dots, with reference to left axis) and external quantum efficiency (squares, with reference to right axis) versus illumination intensity at 975 nm, under an embodiment. The decrease in the EQE (>10 mW cm$^{-2}$) corresponds to the limit where the minority carrier transit time exceeds the recombination lifetime.

In order to efficiently extract carriers, the transit time should be shorter than the characteristic time for carrier relaxation at the relevant intensities, which was measured using the technique of transient open circuit voltage decay (OCVD). The OCVD method was performed on a photovoltaic device by abruptly turning off the illumination and recording the $V_{oc}$ decay. The device was illuminated using a 975 nm laser at different intensities. The voltage generated across the device was recorded as the illumination was abruptly removed (within 3 µs). The recombination lifetime at every intensity was determined by applying a linear fit to the initial $V_{oc}$ decay.

Figure 16:
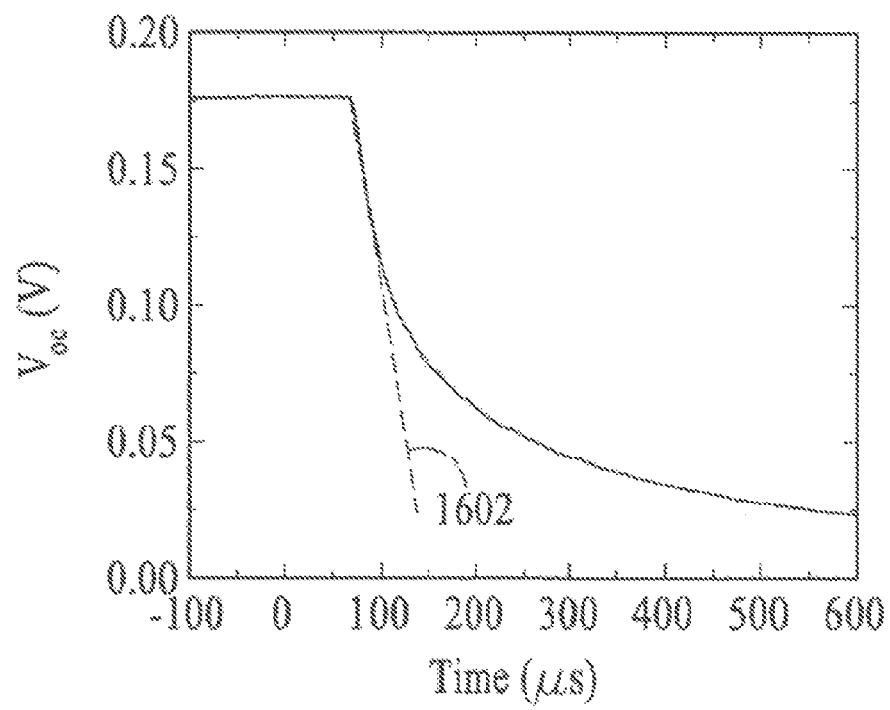
FIG. 16 shows a typical OCVD transient.

FIG. 16 shows a typical OCVD transient. The recombination was evaluated from the following relation $$\tau = C \times \frac{kT1}{qdV_{oc}/dt'}$$

where k is the Boltzmann constant, T is temperature, q is the elementary charge. The recombination lifetime is evaluated from the slope 1602 of the voltage transient decay. From the slope 1602, the lifetime was estimated to be 10 µs at 20 mW cm$^{-2}$. The coefficient C varies from 1 in low injection regime to 2 in high injection regime. For this analysis, the recombination lifetime was underestimated and set C to 1. At the operating intensity of 12 mW cm$^{-2}$, the lifetime was found to be 13 µs.

Thin film field-effect transistors (FET) were fabricated on highly conductive silicon wafers with 100 nm of thermally grown oxide as the gate dielectric. The source and drain electrodes were separated by a 10 µm gap. In order to spin-coat 50 nm thick films, the octylamine-capped PbSe NCs was diluted to a concentration of 10 mg mL$^{-1}$ and the benzenedithiol solution to 1 mM. For constant drain source voltage, a range of gate voltages was applied and recorded the current modulation through the NC film.

Figures 17, 18:
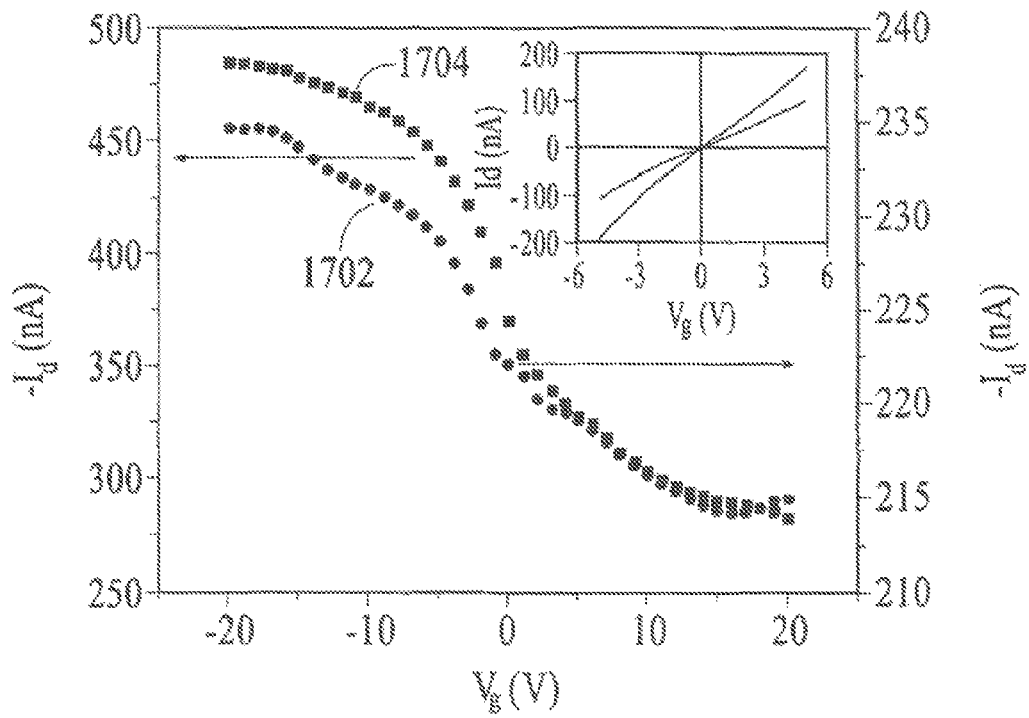
FIG. 17 shows transfer characteristics of PbSe NC thin film field-effect transistors, under an embodiment.
FIG. 18 summarizes the calculated charge transport characteristics, under an embodiment.

FIG. 17 shows the FET transfer characteristics of PbSe NC thin film field-effect transistors, under an embodiment. These FET transfer characteristics are for NC films directly deposited from solution and after exposure to benzenedithiol treatment. The $I_d$-$V_d$ characteristics for both films are shown in the inset. The PbSe NC films exhibit p-type behaviour before (dots 1702) and after benzenedithiol treatment (squares 1704). The conductivity, which can be induced from the slope of the $I_d$-$V_d$ curves, increased after treatment. In both cases, the drain current ($I_d$) increases in magnitude as the applied gate voltage ($V_{gs}$) becomes more negative. This suggests the formation of a p-channel in the FET devices indicative of the p-type behaviour of the PbSe NCs.

Thin films field-effect transistors (FET) were fabricated on highly doped n-type silicon wafers with 100 nm of thermally grown oxide as the gate dielectric. The source and drain electrodes were separated by a 10 um gap. The FET devices were completed by spin-coating thin layers of PbSe NCs. The PbSe CQD films exhibited p-type behavior both before and after treatment.

The conductance (G) of the NC films, equated to the slope of the $I_d$-$V_d$ graph at zero gate bias (inset of FIG. 15), increased after the film treatment. The field effect devices presented suffered from very low $I_{on}/I_{off}$ ratio (weak modulation) which is a consequence of high leakage current in the off-state, inherent of the thin film FET transistor architecture.

Carriers in the depletion region are separated via the action of the built-in field resultant from the metal-semiconductor, or Schottky, junction. The drift length is given by $$\frac{\mu \tau V_{bi}}{W},$$

where, µ is the carrier mobility, $V_{bi}$ is the built in potential, and W is the depletion width. Under short circuit conditions at 12 mW cm$^{-2}$ and assuming a built in voltage of 0.3 V, drift lengths of 8.5 µm were estimated for electrons and 14.5 µm for holes. In sum, no difficulty is expected in removing each carrier type from the 65 nm thick depletion region.

In the quasi-neutral region, charge transport occurs mainly through diffusion and the carrier diffusion length may be obtained from $$\sqrt{\mu \tau \frac{kT}{q}}.$$

The calculated electron minority diffusion length is in excess of 220 nm, which allows a substantial fraction of the minority carriers to diffuse out of the neutral region, and allows accounting for the high observed EQE. FIG. 18 summarizes the calculated charge transport characteristics, under an embodiment.

From the transport parameters calculated, the hole diffusion length was estimated to be 350 nm and the electron minority diffusion length was estimated to be 220 nm (equations included in the main text). These values are evaluated in low injection mode with the minimal value of the recombination lifetime 13 µs; thus, the minimum value of the minority diffusion length is 220 nm. Referring to FIG. 13, the latter value is found to be very close to the required diffusion length.

Given a diffusion length of 220 nm and assuming that after 0.1τ a large fraction of the carriers are lost to recombination, 14% of the photogenerated carriers diffuse through the quasi-neutral region and get separated in the depletion region. Thus, adding the depletion region contribution a total of 27% EQE can be accounted for, and that is with lower limit for the recombination lifetime. Thus, the model described herein is presumed valid and the diffusion of electrons through the quasi-neutral region to the depletion region contributes significantly to the charge extraction process in the devices of an embodiment.

Carrier extraction in these photovoltaic devices, due to the narrow depletion region, is critically dependent on diffusion enabled by high minority carrier mobility and long lifetime. This contrasts with recent findings in drift-dominated PbS Schottky-barrier devices.

The proposed physical picture of an embodiment is further corroborated by investigating the dependence of EQE and recombination as a function of illumination intensity, as seen in FIG. 13. The EQE began to diminish at intensities greater than 10 mW cm$^{-2}$. From OCVD measurements, the recombination lifetime drops below about 10 µs at such intensities. In view of the electron mobility, the electron diffusion length begins to contract well below the quasi-neutral region thickness under such conditions, accounting for the onset of EQE roll-off.

With this performance and physical picture explained, the role of the bidentate linker of an embodiment is described. The first expected impact of linking nanoparticles in the solid state is to bring the particles closer together (see FIGS. 5A, 5B, and 5C). FIG. 5C shows that benzendithiol molecules are most likely crosslinking the PbSe nanoparticles. Specifically, both electron and hole mobilities increased by more than an order of magnitude as a result of crosslinking Even with the mobility-increasing treatments, the films retained their quantum size effect, as seen in absorption spectra and external quantum efficiency spectra.

It is noted above that diffusion plays a much larger role in the devices of an embodiment than in the typical PbS solar cells. The electron mobility of the devices of an embodiment is approximately seven times greater than typical PbS solar cells, a fact which accounts for a doubling of the electron minority diffusion length in the materials system described herein. Benzenedithiol is in fact a molecular conductor in view of its delocalization of electron molecular orbitals. In addition, conjugated dithiol molecules used to bridge quantum dot systems have previously been reported not only to link nanocrystals, but also to provide a pathway for electron transfer.

The devices described herein exhibited a photovoltaic response only after being subjected to the benzenedithiol crosslinking process. It is herein proposed that the as exchanged NCs were dominated by a large density of unpassivated surface states. As with previously-reported chemical processes on PbSe and CdSe NCs, benzenedithiol offers passivation of dangling bonds. Additionally, as seen in the stability study, benzenedithiol appears to offer a longer-lived NCs/metal interface than do amine ligands. The latter are believed to react with the top metal contact.

Another feature of the device processing architecture described herein is the use of two superimposed layers of colloidal quantum dot solids to increase absorbing thickness and minimize pinholes. Preceding the solid-state treatment with a solution-phase exchange to a somewhat shorter ligand helped to reduce volume contraction upon crosslinking of the film. This contributed to the realization of densely-packed, high-mobility films in situ on a substrate.

In sum, the devices of an embodiment are stable, high-efficiency infrared solution-processed photovoltaic devices. Further, it was shown herein that minority carrier diffusion can occur efficiently over hundreds of nanometers in such films. Strongly-passivating, short, electron-transport-assisting bidentate linkers appear to play a key role in achieving these properties.

The chemicals used in producing an embodiment include one or more of the following, but are not so limited: Lead (II) oxide powder (PbO, 99%); Oleic acid (OA, technical grade 90%); 1-Octadecene (ODE, technical grade 90%); anhydrous toluene; octane; methanol; isopropanol; acetonitrile; ethyl acetate; Bis(trimethylsilyl)selenide (TMSe); 1,4 benzenedithiol (97%).

Regarding PbSe synthesis and ligand-exchange procedures of an embodiment, ODE was degassed by pre-pumping at 80° C. for 16 hours and TMSe source was pre-filtered with 0.1 and 0.02 µm Whatman syringe filters before use. The synthesis was performed in a single, three-neck, round bottom flask. The Pb precursor was prepared by pumping the mixture of PbO and OA at 80° C. for 16 hours. The resulting transparent solution of lead oleate precursor was stirred vigorously while being heated under Ar for about 30 min. The stock solution of selenium precursor was prepared by mixing TMSe with ODE in a glove box and the portion corresponding to a 2:1 (Pb:Se) molar ratio was rapidly injected into the reaction flask. The injection temperature ranged between 125° C. for smaller nanocrystals and 140° C. for the largest NCs. Upon injection, nucleation occurs instantly; thus, rapid injection is critical to achieve a narrow size distribution. After injection, the temperature of the reaction was dropped down and the reaction was quenched by subjecting it to a water-ice bath for 1 min and 40 sec. A typical synthesis for NCs having their excitonic peak ranging from 1200 nm and 1300 nm involved injecting of 7 mL of selenium stock solution (1 mmol of TMSe) into the reaction flask containing 2 mmol PbO (0.45 g), and 63 mmol of OA. PbSe NCs, particularly in their solution phase, were observed to be extremely sensitive to both air and moisture and as a result all post-synthetic treatments were performed in a glove box with anhydrous reagents. The oleate-capped PbSe NCs were isolated from any remaining starting materials and side products by precipitating the solution with a mixture of equal volumes of methanol (5 mL) and ethylacetate (5 mL). The precipitate was then redispersed in toluene and re-precipitated with methanol. After the second precipitation, the NCs were vacuum-dried for 10 min and redispersed in toluene.

The solution exchange procedure was carried out inside a nitrogen filled glovebox. The as-synthesised NCs were precipitated with methanol, vacuum-dried for 10 min, and redispersed in octylamine. After three days, the NCs were precipitated with anhydrous isopropanol, vacuum-dried for 10 min and redispersed in octane solution to achieve a typical concentration of 80 mg mL$^{-1}$.

Regarding device fabrication, testing, and characterization, the octylamine-exchanged PbSe NCs were spin-coated on ITO-coated glass substrate inside the glovebox. The devices had a typical thickness of 210 to 250 nm as measured with a surface profiler (Veeco Dektak3). The benzenedithiol treatment was done in a fumehood in air. Approximately 100 nm Mg/190 nm Ag were deposited by thermal evaporation through a shadow mask, leading to a contact area of 3.1 mm$^2$. The devices were stored in 10a nitrogen filled glovebox for 24 h before initial testing. All device characterizations were carried out in dark shielded enclosures in air.

All current-voltage measurements including FET characterizations were taken with an Agilent 4155C semiconductor parameter analyzer. For the IR characterizations, the devices were illuminated through the ITO-coated glass using a continuous-wave diode laser operating at 975 nm. An Oriel solar simulator operating at 100 mW cm$^{-2}$ was used to simulate the solar spectrum under AM1.5 conditions. The illumination intensity was measured with a Melles-Griot broadband power meter.

For the TOF measurements, thick samples (>600 nm) were excited using a Yttrium-Aluminum-Garnet (YAG) laser operating at 532 nm with 10 ns pulses at a 10 Hz repetition rate. The light was incident on the sample from the transparent ITO side. The devices were biased using a Keithley 2400 Source Meter, and a digital oscilloscope was used to measure the current transient output across a 50Ω load. The CELIV measurements were carried out using an Agilent 33120A function generator which provided the linearly increasing voltage signals and the current output was measured across a 50Ω load with a Tektronix IDS 220 digital oscilloscope.

The OCVD curves were recorded using a digital oscilloscope with a 1 MΩ input impedance. The illumination source (975 nm diode laser) was modulated using a Stanford Research Systems DG535 digital pulse generator. An Agilent 4284A LCR meter was used to measure the capacitance at zero bias in order to determine the device depletion width.

For the external quantum efficiency spectrum measurements, the incident light was chopped at 100 Hz and the short-circuit current was measured with a Stanford Research SR830 lock-in amplifier. Illumination was provided by a white light source dispersed by a Jobin-Yvon Triax 320 monochromator. The light intensity was kept constant for all wavelengths. The measured spectrum was then scaled to match the value of the monochromatic EQE obtained at 975 nm.

The total film absorbance was obtained by measuring the reflectivity of the substrate and correcting for the ITO and Mg contact absorption in an integrating sphere. A Cary 500 UV-Vis-IR Scan photospectrometer in the reflective mode was used to measure the reflectivity spectra. TEM images were taken using a Hitachi HD-2000.

Synthesis of CIGS Nanoparticles: Achieving Monodispersity, Crystallinity, and Phase-Purity Colloidal nanoparticles have been shown to enable the realization of low-cost, large-area, physically flexible photodetectors, photovoltaics, optical modulators, and optical sources. Devices realized to date have typically relied on semiconductor nanoparticles containing either Cd- or Pb-. The use of these metal cations leads to a robust and facile synthesis; however, the use of these metals raises concerns regarding compatibility with the natural environment, especially if large-area deployment, such as is desired in the case of solar cells, were sought.

As an alternative, the synthesis of $CuInS_2$ $CuInSe_2$ and $Cu(InGa)Se_2$ (CIGS) nanoparticles has recently been pursued. Polycrystalline CIGS films have long been advanced as a solar energy conversion material, providing high efficiencies of 19.2% in a laboratory device and excellent radiation hardness.

The realization of third-generation solar cells having greater than 30% AM1.5 power conversion efficiencies can be achieved by stacking different-bandgap semiconductors on one another to form tandem (e.g., two-junction) or multijunction cells. A first cell of the stack absorbs higher-energy photons only, and provides a large opencircuit voltage; the next cells of the stack absorb the lower-energy photons, and, series-connected, provide additive contributions to the open-circuit voltage. The layers of the optimal tandem cell (two-junction) have bandgaps at 1.3 um and 800 nm and take the limiting efficiency up to 44% compared to the 32% limiting efficiency of an optimal single-junction device.

Quantum size-effect tuning provides one means of deploying materials of a single composition to address the different needed spectral regions. The use of ternary and quaternary chalcopyrite nanoparticles adds a further degree of freedom in harnessing efficiently the various band's within the sun's spectrum reaching the earth: the tuning of stoichiometry. With bandgaps 740 nm and 1.23 eV, $CuGaSe_2$ and $CuInSe_2$ are excellent candidates for the two junctions of a near-optimal tandem cell. Tuning CIGS stoichiometry along the continuum between $CuGaSe_2$ and $CuInSe_2$ provides continuous optimization over the intervening spectral range.

The realization of the benefits described above is found through CGS, CIS, and CIGS colloidal nanoparticles exhibiting one or more of the following characteristics: purity of phase (to generate a single bandgap within each junction); colloidal stability and a lack of aggregation (to ensure practical processing); excellent crystallinity (to provide sharp absorption onsets needed in optimized multijunction devices).

Compared with the well-developed synthesis of binary nanoparticles, the production of monodisperse ternary and quaternary chalcopyrite nanoparticles in solution remains a challenge. $CuGaSe_2$ nanoparticles have not previously been synthesized in the solution phase. Synthesis of $CuInSe_2$ nanoparticles and nanorods in solution has been reported to produce a wide dispersion in size. CIGS nanoparticles have been synthesized in methanol or pyridine at low temperature and employed as precursors for spray pryrolysis of CIGS thin film; however, these materials resulted in either large, uncontrolled aggregate formation, or, unless annealed at elevated temperatures, generated amorphous materials.

A description follows of the facile synthesis of phase-pure $CuGaSe_2$, $CuInSe_2$ and CIGS nanoparticles in oleyamine using hot injection methods. Monodisperse $CuGaSe_2$, and CIGS nanoparticles with good crystallinity were synthesized for the first time. Low-cost commercial salts, selenium powder, and technical grade oleylamine were employed as precursors.

The strategy used in an embodiment relied on the careful choice of precursor and ligand combinations, and the success and failure of various strategies confined the criticality of ensuring similar reactivities of the various components in successfully synthesizing monodispersed and phase-pure ternaries and quaternaries. Without such reactivity-matching, a plurality of phases and/or broad size and morphology distribution of products are obtained. Specifically, monodisperse chalcopyrite nanoparticles were synthesized under the hypotheses that: there is rapid formation of chalcopyrite compounds in mixtures of appropriate precursors with liquid Se; Cu, In, and Ga salts as well as selenium powders dissolve in oleyamine at elevated temperatures to enable chalcopyrite nanoparticle formation; the injection ratio of precursors must favor of ternary and quaternary compound formation and avoid binary compounds in a successful synthesis.

In a typical optimized synthesis of CIGS nanoparticles, 0.2 mmol $Cu(acac)_3$ (acac-acetylacetate), 0.1 mmol $In(acac)_3$ and 0.1 mmol $Ga(acac)_3$ were dissolved in 5 ml oleylamine at 80° C., producing a clear stock solution. Separately, 0.4 mmol selenium powder was added to 10 ml oleylamine and heated to 250° C. until it turned clear orange. The stock solution was swiftly injected into the selenium solution under vigorous stirring, and the heating mantle was turned off but left in place. The solution turned into black immediately, suggesting rapid nucleation. The temperature slowly dropped to 100° C. and then was heated back to 250° C. and incubated for 1 hour. The products were rinsed with methanol and toluene twice, and finally dispersed in toluene.

Figure 19A:
FIG. 19A shows TEM images of chalcopyrite (CuGaSe$_2$) nanoparticies synthesized along with their corresponding SAED pattern, under an embodiment.
Figure 19B:
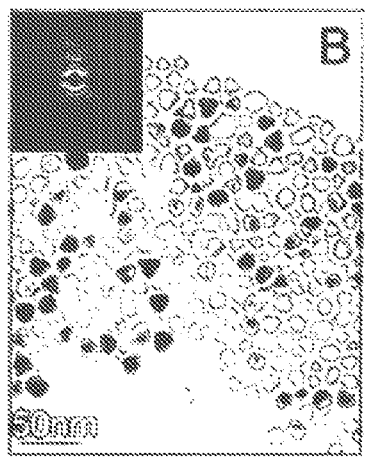
FIG. 19B shows TEM images of chalcopyrite (CuInSe$_2$) nanoparticies synthesized along with their corresponding SAED pattern, under an embodiment.
Figure 19C:
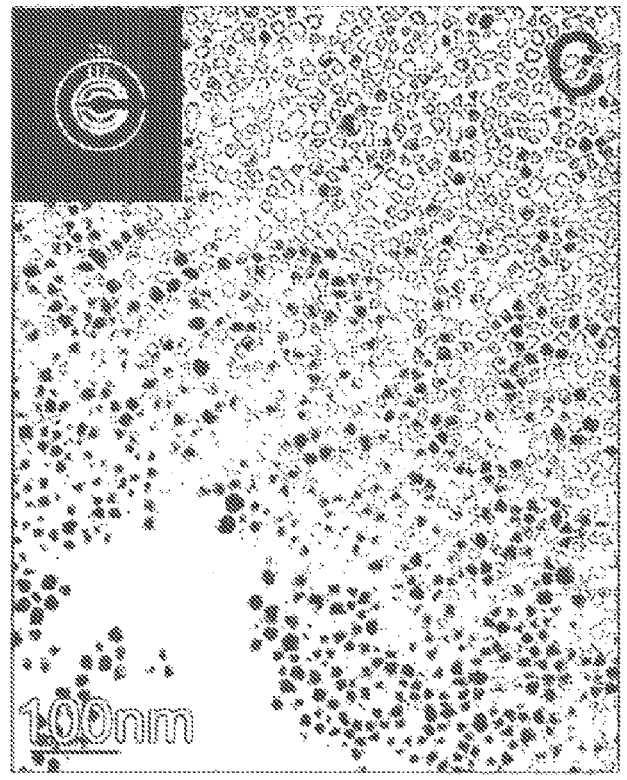
FIG. 19C shows TEM images of chalcopyrite (CIGS) nanoparticies synthesized along with their corresponding SAED pattern, under an embodiment.

The sizes, morphologies, crystallinities, and composition of the synthesized particles were examined using transmission electron microscopy (TEM), selected area electron diffraction (SAED), and powder X-ray diffraction (XRD). FIG. 19A shows TEM images of chalcopyrite ($CuGaSe_2$) nanoparticies synthesized along with their corresponding SAED pattern, under an embodiment. $CuGaSe_2$ nanoparticies were plate-like with irregular morphology and average size 11 nm. FIG. 19B shows TEM images of chalcopyrite ($CuInSe_2$) nanoparticles synthesized along with their corresponding SAED pattern, under an embodiment. $CuInSe_2$ nanoparticles were a mixture of triangular, deformed hexagonal, and round plate-like nanoparticles with average size 16 nm. FIG. 19C shows TEM images of chalcopyrite (CIGS) nanoparticles synthesized along with their corresponding SAED pattern, under an embodiment. CIGS nanoparticles had average diameter 15 nm.

Figure 21A:
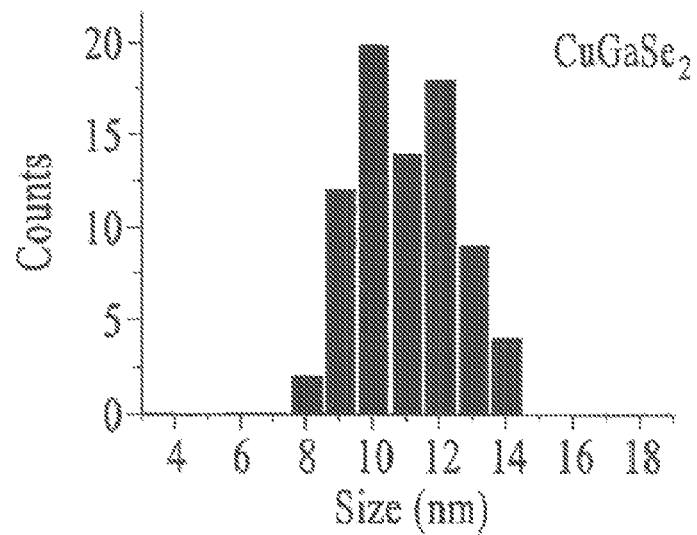
FIGS. 21A through 21C show plots of size distributions of as-synthesized nanoparticies (data based on manual counts of 80 nanoparticies from TEM images), under an embodiment.
Figure 21B:
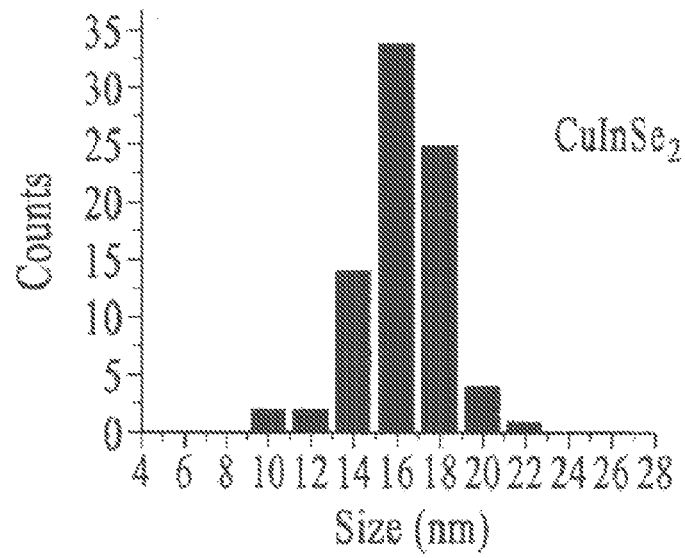
Figure 21C:
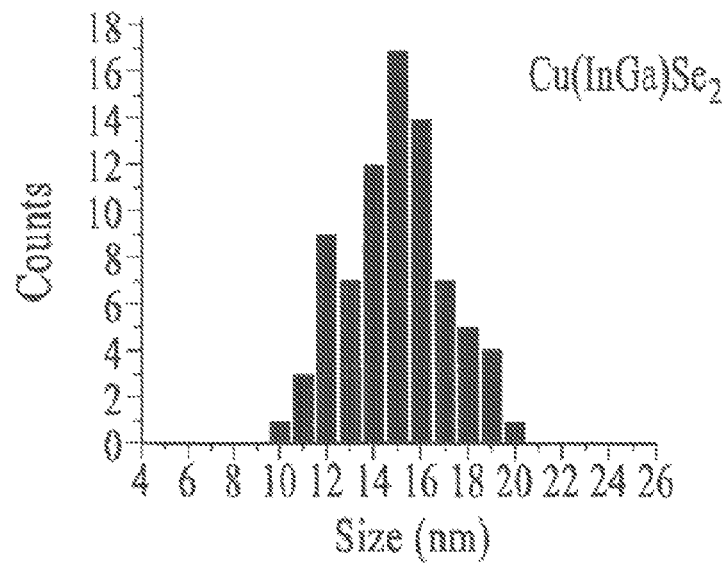

FIG. 21 shows plots of size distribution of as-synthesized nanoparticies (data based on manual counts of 80 nanoparticles from TEM images), under an embodiment. Each of these samples showed a narrow size distribution and their average sizes agree well with those calculated based on XRD.

The spacing among nanoparticles in all samples was approximately 2.4 nm, twice the length of their passivating oleylamine ligand.

Figure 20A:
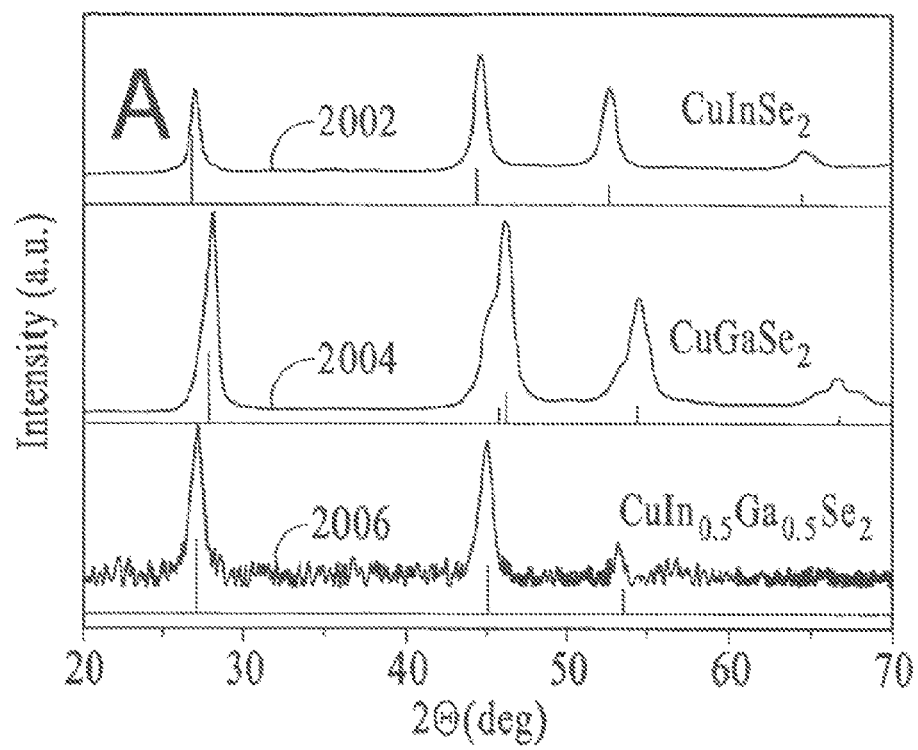
FIG. 20A shows powder XRD patterns of CuGaSe$_2$, CuInSe$_2$ and CIGS nanoparticies, under an embodiment. The vertical lines below indicate the corresponding reflection peaks for bulk CuIn$_{0.5}$Ga$_{0.5}$Se$_2$, (JCPDS 40-1488), CuGaSe$_2$, (JCPDS 79-1809) and CuInSe$_2$, (JCPDS 40-1487).
Figure 20B:
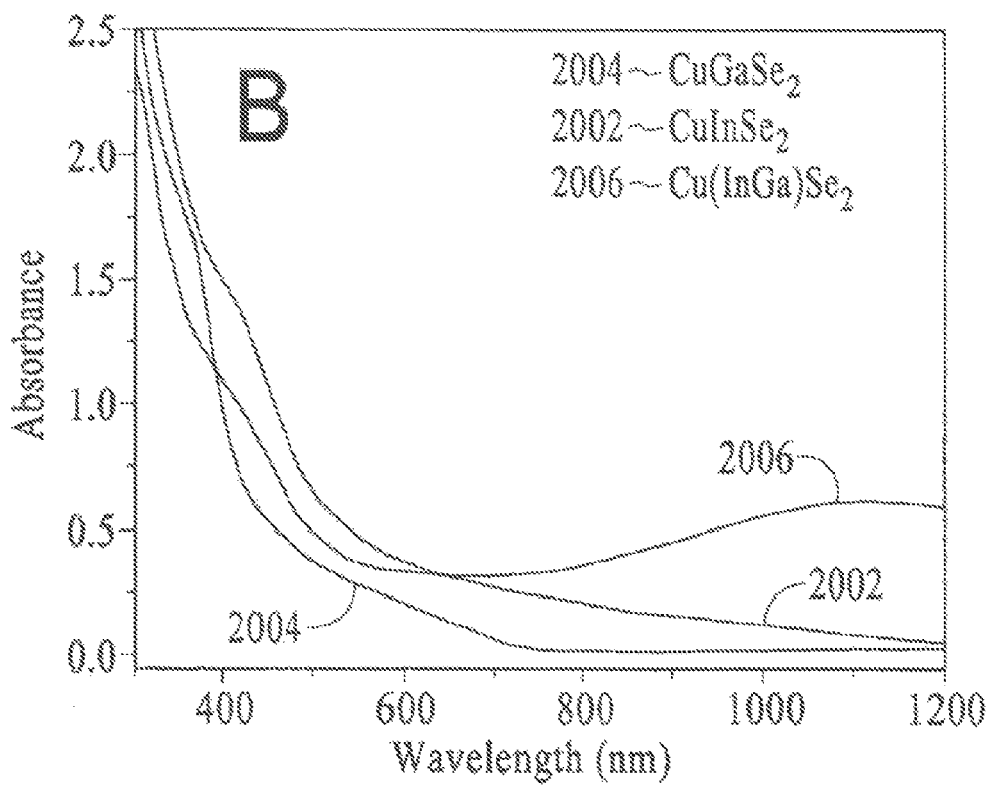
FIG. 20B shows an ensemble of UV-vis-NIR absorption spectrum of CuGaSe$_2$, CuInSe$_2$ and CIGS nanoparticies in toluene, under an embodiment.

FIG. 20A shows powder XRD patterns of CuGaSe$_2$ 2004, CuInSe$_2$ 2002 and CIGS 2006 nanoparticles, under an embodiment; the vertical lines below indicate the corresponding reflection peaks for bulk CuIn$_{0.5}$Ga$_{0.5}$Se$_2$ (JCPDS 40-1488), CuGaSe$_2$ (JCPDS 79-1809) and CuInSe$_2$ (JCPDS 40-1487). SAED (see the insets of FIG. 19) and XRD (see FIG. 20A) confirmed excellent crystalline quality of all of the optimally-synthesized particles of an embodiment. XRD diffraction peaks matched very closely the bulk standard patterns of CuGaSe$_2$ (JCPDS 79-1809), CuInSe$_2$ (JCPDS 40-1487) and Cu(In$_{0.5}$Ga$_{0.5}$)Se$_2$ (JCPDS 40-1488), respectively. In all cases, the match is with the low-temperature tetragonal phase. FIG. 20B shows an ensemble of UV-vis-NIR absorption spectrum of CuGaSe$_2$ 2004, CuInSe$_2$ 2002, and CIGS 2006 nanoparticles in toluene, under an embodiment.

Figure 22A:
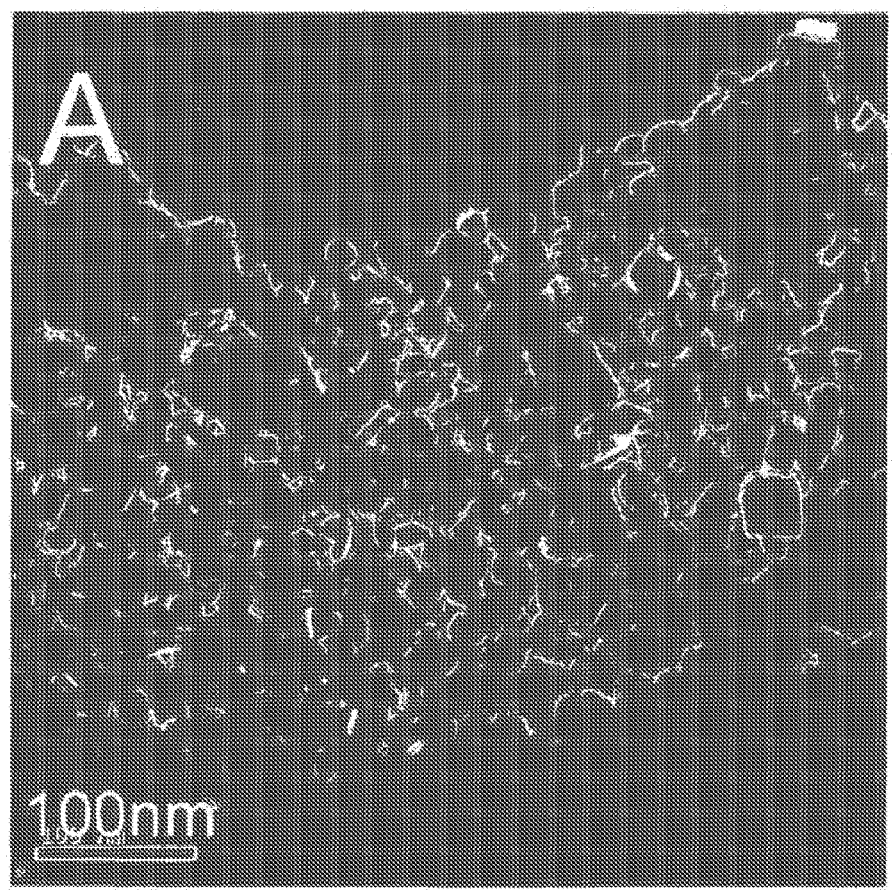
FIG. 22A shows TEM images of CuGaSe$_2$ synthesized by cooking Cu(Ac), Ga(acac)$_3$ and Se powder in oleylamine at 250 C., under an embodiment.
Figures 22B, 22C:
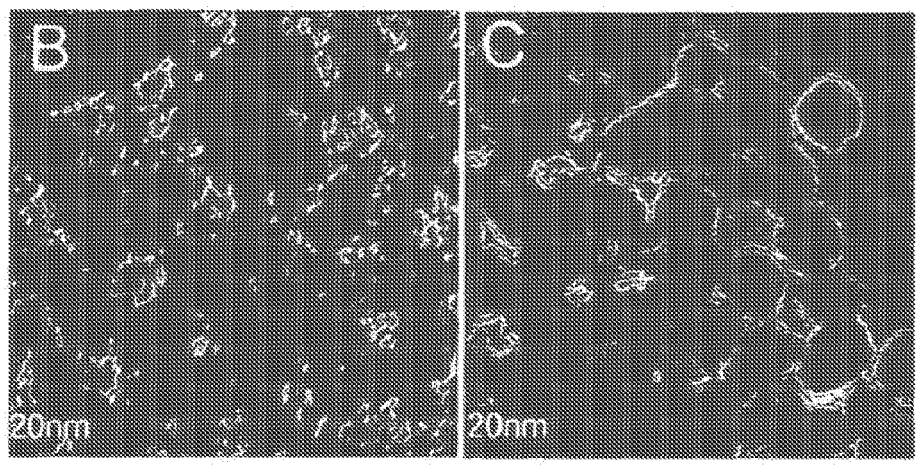
FIGS. 22B and 22C show TEM images of CuInSe$_2$ synthesized by cooking Cu(Ac), In(Ac)$_3$ and Se powder in oleylamine at 250 C., under an embodiment.
Figures 23A, 23B:
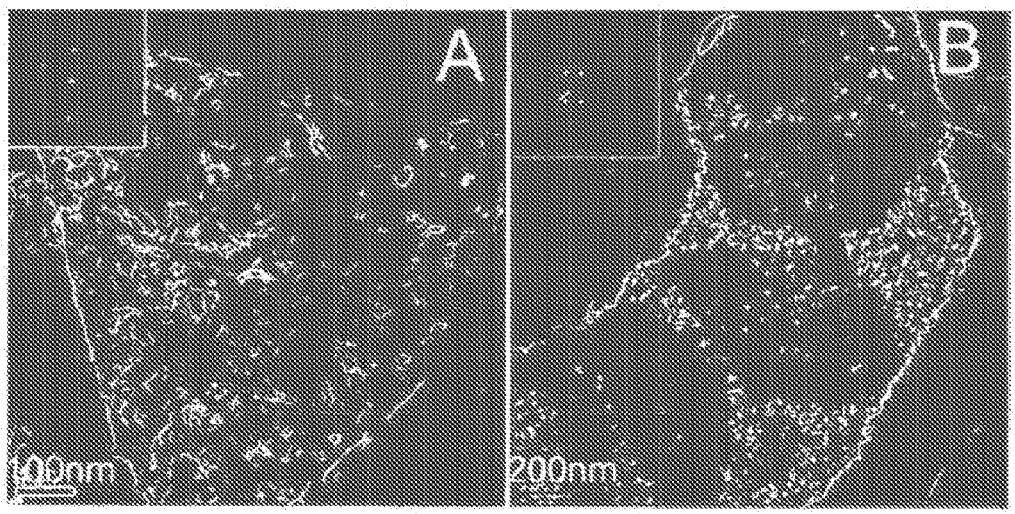
FIG. 23A shows TEM images and corresponding SAED of CuGaSe$_2$ hexagonal microplates obtained in oleylamine and oleic acid mixture, under an embodiment.
FIG. 23B shows TEM images and corresponding SAED of CuInSe$_2$ hexagonal microplates obtained in oleylamine and oleic acid mixture, under an embodiment.
Figure 24A:
FIG. 24A shows TEM images of CuInSe$_2$ nanoparticies synthesized from Cu(acac)$_2$ and In(Ac)$_3$ precursors at 250° C. (scale bars are 50 nm), under an embodiment.
Figure 24B:
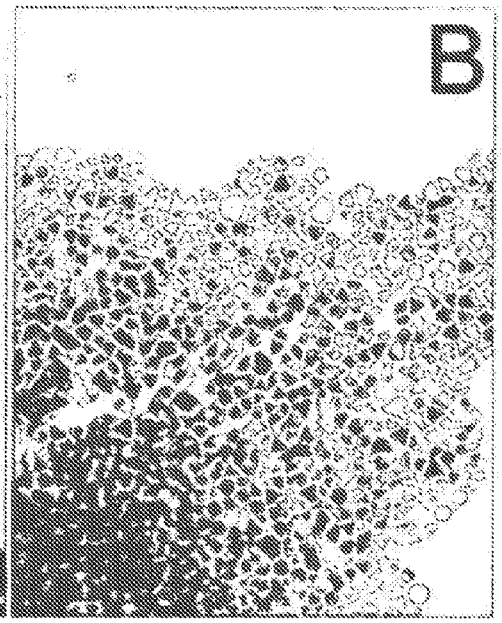
FIG. 24B shows TEM images of CuInSe$_2$ nanoparticies synthesized from Cu(Ac) and In(Ac)$_3$ precursors at 250° C. (scale bars are 50 nm), under an embodiment.
Figure 24C:
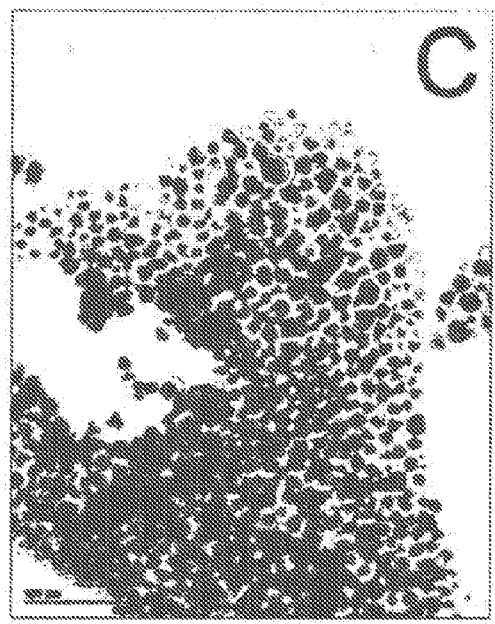
FIG. 24C shows TEM images of CuInSe$_2$ nanoparticies synthesized from Cu(acac)$_2$ and In(acac)$_2$ precursors at 250° C. (scale bars are 50 nm), under an embodiment.
Figure 24D:
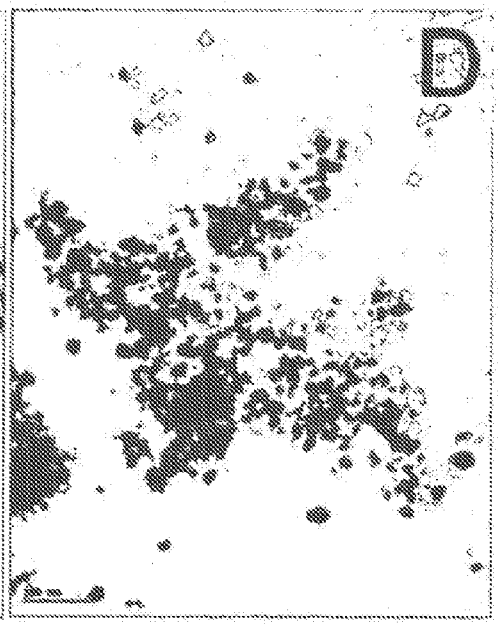
FIG. 24D shows TEM images of CuInSe$_2$ nanoparticies synthesized from Cu(Ac) and In(acac)$_3$ precursors at 250° C. (scale bars are 50 nm), under an embodiment.

FIG. 22A shows TEM images of CuGaSe$_2$ synthesized by cooking Cu(Ac), Ga(acac)$_3$ and Se powder in oleylamine at 250 C., under an embodiment. FIGS. 22B and 22C show TEM images of CuInSe$_2$ synthesized by cooking Cu(Ac), In(Ac)$_3$ and Se powder in oleylamine at 250 C., under an embodiment. FIG. 23A shows TEM images and corresponding SAED of CuGaSe$_2$ hexagonal microplates obtained in oleylamine and oleic acid mixture, under an embodiment. FIG. 23B shows TEM images and corresponding SAED of CuInSe$_2$ hexagonal microplates obtained in oleylamine and oleic acid mixture, under an embodiment. FIG. S4A shows TEM images of CuInSe$_2$ nanoparticles synthesized from Cu(acac)$_2$ and In(Ac)$_3$ precursors at 250° C. (scale bars are 50 nm), under an embodiment. FIG. 24B shows TEM images of CuInSe$_2$ nanoparticles synthesized from Cu(Ac) and In(Ac)$_3$ precursors at 250° C. (scale bars are 50 nm), under an embodiment. FIG. 24C shows TEM images of CuInSe$_2$ nanoparticles synthesized from Cu(acac)$_2$ and In(acac)$_2$ precursors at 250° C. (scale bars are 50 nm), under an embodiment. FIG. 24D shows TEM images of CuInSe$_2$ nanoparticles synthesized from Cu(Ac) and In(acac)$_3$ precursors at 250° C. (scale bars are 50 nm), under an embodiment.

It was determined that the hot injection method, as well as the specific choice of ligands and precursors described above, was crucial to successful synthesis. When all precursors were mixed and heated, a relatively wide size dispersion, including large aggregates, resulted (FIG. S2). Syntheses that employed ligands such as trioctylphosphine, trioctylphosphine oxide, dodecanethiol, oleic acid, stearic acid, and combinations thereof, generally failed, with the exception that single-crystalline CuInSe$_2$ nanoplates were obtained in a mixture of oleylamine and oleic acid (see FIG. 23). Best results were obtained using Cu(acac)$_2$ and Ga(acac)$_3$ for CuGaSe$_2$. Best results were obtained using Cu(acac)$_2$ and InCl$_3$ for CuInSe$_2$. Best results were obtained using Cu(acac)$_2$, In(acac)$_3$ and Ga(acac)$_3$ for CIGS. Alternative precursor combinations resulted in wide size distribution (seen by TEM) and multiple phases of products (seen by comparison of XRD with standards) (see FIG. 24).

Figure 25A:
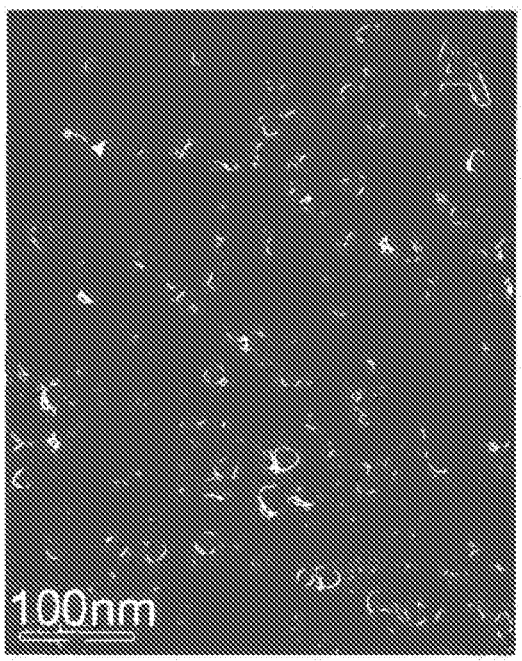
FIG. 25A shows TEM images of CIGS nanoparticies synthesized by injection Cu(acac)$_2$, In(acac)$_3$ and Ga(acac)$_3$ oleylamine solution into Se/oleylamine at an injection temperature of 270° C., under an embodiment.
Figure 25B:
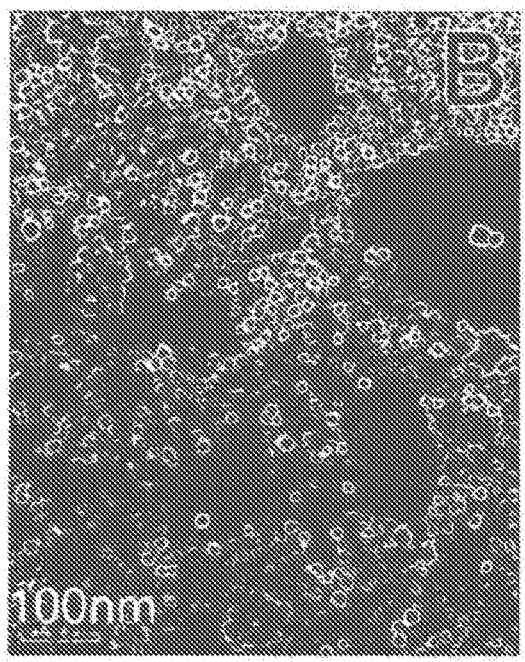
FIG. 25B shows TEM images of CIGS nanoparticies synthesized by injection Cu(acac)$_2$, In(acac)$_3$ and Ga(acac)$_3$ oleylamine solution into Se/oleylamine at an injection temperature of 220° C., under an embodiment.
Figures 26A, 26B:
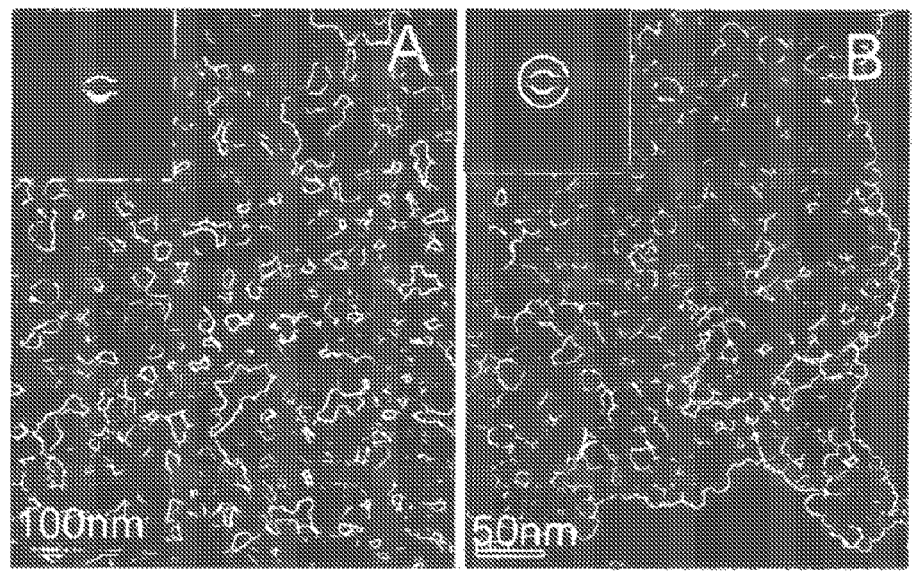
FIG. 26A shows TEM images of CIGS nanoparticles synthesized with a precursor ratio CIGE3228-0.15 mmol Cu(acac)$_2$, 0.1 mmol Ga(acac)$_3$ and 0.1 mmol In(acac)$_3$ to 0.4× mmol Se, under an embodiment.
FIG. 26B shows TEM images of CIGS nanoparticles synthesized with a precursor ratio CIGE4138-0.20 mmol Cu(acac)$_2$, 0.15 mmol Ga(acac)$_3$ and 0.05 mmol In(acac)$_3$ to 0.40 mmol Se, under an embodiment.
Figure 26C:
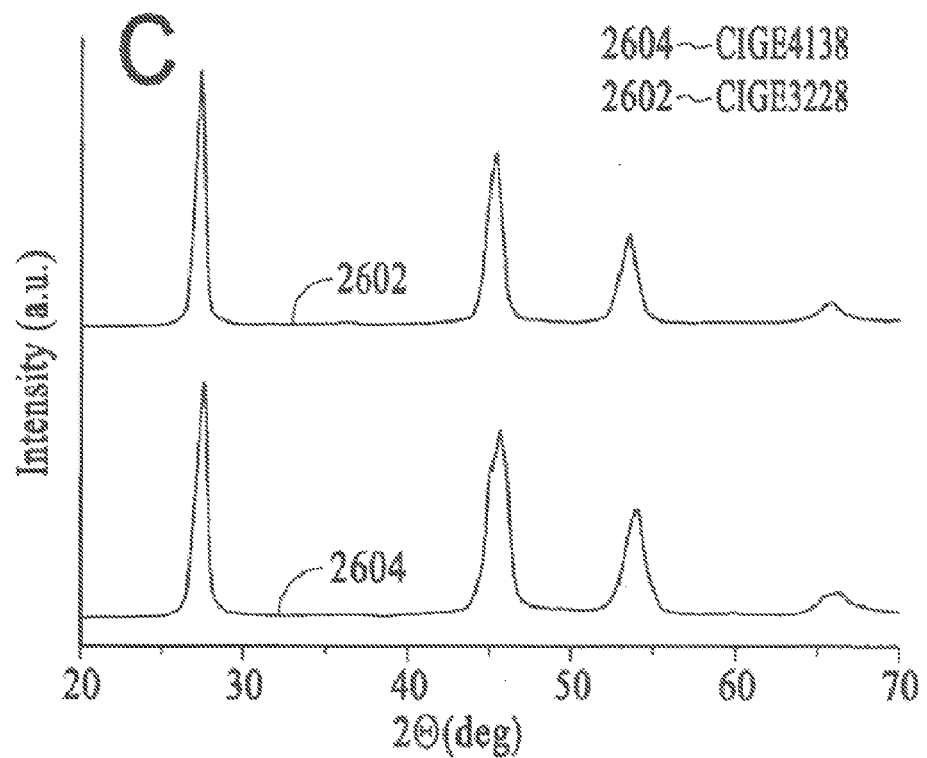
FIG. 26C shows XRD patterns of CIGS nanoparticies synthesized with precursor ratios CIGE3228-0.15 mmol Cu(acac)$_2$, 0.1 mmol Ga(acac)$_3$ and 0.1 mmol In(acac)$_3$ to 0.4 mmol Se, and CIGE4138-0.20 mmol Cu(acac)$_2$, 0.15 mmol Ga(acac)$_3$ and 0.05 mmol In(acac)$_3$ to 0.40 mmol Se, under an embodiment.

FIG. 25A shows TEM images of CIGS nanoparticles synthesized by injection Cu(acac)$_2$ In(acac)$_3$ and Ga(acac)$_3$ oleylamine solution into Se/oleylamine at an injection temperature of 270° C., under an embodiment. FIG. 25B shows TEM images of CIGS nanoparticles synthesized by injection Cu(acac)$_2$, In(acac)$_3$ and Ga(acac)$_3$ oleylamine solution into Se/oleylamine at an injection temperature of 220° C. under an embodiment. FIG. 26A shows TEM images of CIGS nanoparticies synthesized with a precursor ratio CIGE3228-0.15 mmol Cu(acac)$_2$, 0.1 mmol Ga(acac)$_3$ and 0.1 mmol In(acac)$_3$ to 0.4 mmol Se, under an embodiment. FIG. 26B shows TEM images of CIGS nanoparticles synthesized with a precursor ratio CIGE4138-0.20 mmol Cu(acac)$_2$, 0.15 mmol Ga(acac)$_3$ and 0.5 mmol In(acac)$_3$ to 0.40 mmol Se, under an embodiment. FIG. 26C shows XRD patterns of CIGS nanoparticles synthesized with precursor ratios CIGE3228-0.15 mmol Cu(acac)$_2$, 0.1 mmol Ga(acac)$_3$ and 0.1 mmol In(acac)$_3$ to 0.4 mmol Se 2602 and CIGE4138-0.20 mmol Cu(acac)$_2$, 0.15 mmol Ga(acac)$_3$ and 0.05 mmol In(acac)$_3$ to 0.40 mmol Se 2604, under an embodiment. Table 21 shows composition of CIGS nanoparticies of an embodiment calculated from Inductively Coupled Plasma Atomic Emission Spectrometry (ICP).

In the embodiments described herein, temperature provided for tuning of the size and composition of the CIGS particles. Changing injection temperature between 220 and 270° C. tuned the average size of as-synthesized CIGS from 12 to 18 nm (see FIG. 25). When the precursor ratio of Cu:Ga:In:Se was changed from 4:2:2:8, 4:3:1:8 to 3:2:2:8 while keeping the injection temperature at 250° C., CuGa$_{0.38}$In$_{0.41}$Se$_{1.87}$, CuGa$_{0.47}$In$_{0.30}$Se$_{1.75}$ and CuGa$_{0.41}$In$_{0.83}$Se$_{1.98}$ were obtained, respectively (see FIG. 26 and FIG. 29). The observed deviation of product stoichiometry from precursor ratios is attributed to modestly different reactivities of the metal precursors.

Figure 27:
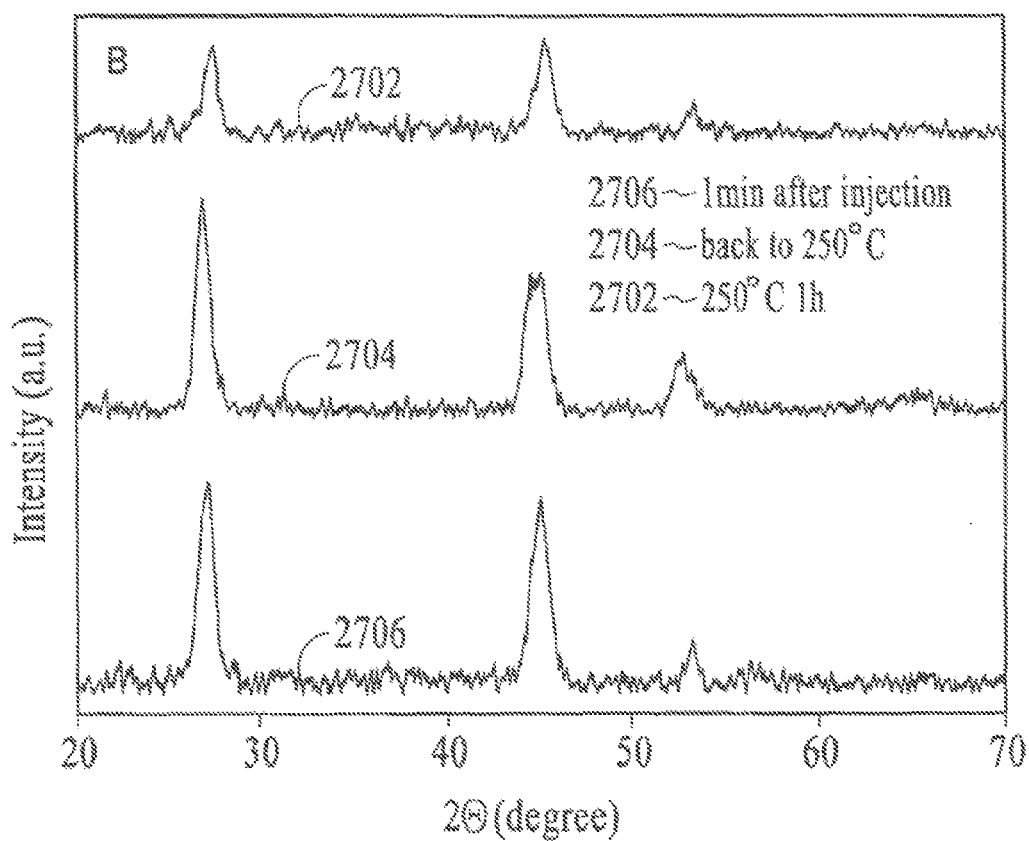
FIG. 27 shows XRD patterns of CIGS nanoparticies arrested for different reaction duration, under an embodiment.

The absorption spectra of as-synthesized CuGaSe$_2$, CuInSe$_2$ and Cu(InGa)Se$_2$ nanoparticles in toluene are presented in FIG. 20B, under an embodiment. The absorption of CuGaSe$_2$ and CuInSe$_2$ begin at 729 nm and 1200 nm, consistent with their bulk bandgaps of 1.68 eV and 1.01 eV. Cu(InGa)Se$_2$ nanoparticles of an embodiment, however, showed strong absorption in the visible and a weak tail in the near infrared possibly attributable to free carrier absorption. FIG. 27 shows XRD patterns 2702-2706 of CIGS nanoparticles arrested for different reaction duration, under an embodiment. The XRD characterization of products obtained one (1) minute after injection in CIGS synthesis showed exclusively Cu(In$_{0.5}$Ga$_{0.5}$)Se$_2$ diffraction peaks, implying that chalcopyrite nanoparticles formed essentially immediately upon injection.

Figures 28A, 28B:
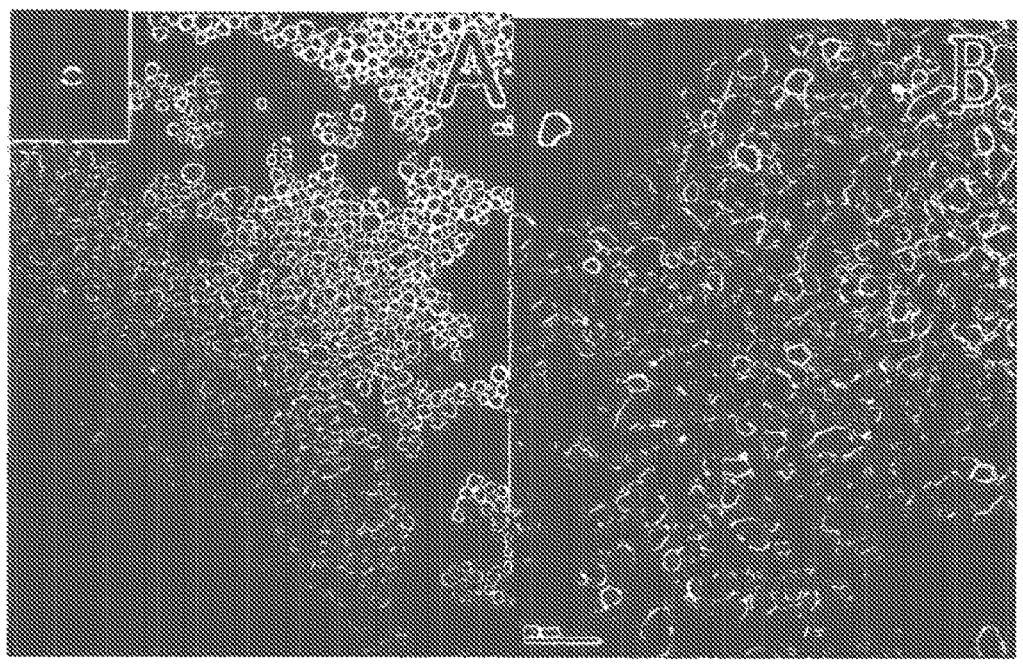
FIG. 28A shows representative TEM images and SAED pattern of CuInS$_2$ nanoparticles produced in oleylamine using sulfur powder instead of selenium powder, under an embodiment.
FIG. 28B shows representative TEM images and SAED pattern of CuGaS$_2$ nanoparticles produced in oleylamine using sulfur powder instead of selenium powder, under an embodiment.

Therefore, facile synthesis of monodispersed, crystalline, single-phase CuGaSe$_2$, CuInSe$_2$ and CIGS nanoparticles was carried out by careful adjustment of precursors and injection temperatures in oleylamine. Preliminary experiments indicate that the same approach may be applied to CuInS$_2$ and CuGaS$_2$ via adoption of sulfur powder as the precursor. FIG. 28A shows representative TEM images and SAED pattern of CuInS$_2$ nanoparticies produced in oleylamine using sulfur powder instead of selenium powder, under an embodiment. FIG. 28B shows representative TEM images and SAED pattern of CuGaS$_2$ nanoparticles produced in oleylamine using sulfur powder instead of selenium powder, under an embodiment. Tuning of size and composition, combined with low cost of precursors and simplicity of fabrication, are of interest in tandem photovoltaic devices.

Experimental details of CuGaSe$_2$, CuInSe$_2$ and CIGS synthesis, isolation and characterization included the use of one or more of the following chemicals, but the embodiment is not so limited: Copper(I) acetate (CuAc); copper (II) acetylacetate (Cu(acac)$_2$); indium (III) chloride (InCl$_3$); indium (III) acetylacetate (In(acac)$_3$); gallium (III) acetylacetate (Ga(acac)$_3$); selenium powder (Se); oleylamine (70%) (pumped under vacuum at 80° C. overnight before use).

Regarding preparation and isolation of CuGaSe2, CuInSe2 and CIGS nanoparticies, all synthesis was carried out with standard schlenk line. A round two-necked flask was located in a heating mantle, and one neck was connected to a condenser while the other neck was sealed by septum and one thermocouple was used to control the temperature. For a typical procedure of CuGaSe$_2$ synthesis, 0.2 mmol Cu(acac)$_2$, 0.2 mmol Ga(acac)$_3$ and 5 ml oleylamine were mixed at room temperature and kept at 80° C. under vacuum for 1 h to dissolve all the precursors completely. This solution was marked as solution A. Then 10 ml oleylamine and 0.4 mmol Se powder were filled in a separate flask, and pumped at 120° C. for 0.5 h to further degas any residual air and/or moisture and then N$_2$ was introduced for the left whole reaction. The solution was heated up to 250° C. in around 10 min and it gradually changed from colorless to orange to brownish red due to the dissolution of Se powder in oleylamine, which generally took about one hour. When no solid Se was left, 5 ml solution A in a syringe with 17 gauge needle was swiftly injected into the solution at 250° C. in about 5 second under vigorous stirring. The solution turned into black at once and turned off the heating mantle immediately (without removal of heating mantle). Temperature decreased slowly to 100° C. in around 15 min and then heated the solution back to 250° C. again and incubated for another 1 h. The solution was always black for the duration of the procedure. When the reaction was done, heating mantle was removed and the flask naturally cooled down to room temperature. Five (5) ml of anhydrous methanol was injected into the raw solution, and the solution was centrifugated at 3000 rpm for 1 min. The clear supernatant was discarded and the black sediments were redispersed in 10 ml anhydrous toluene. Five (5) ml methanol was added to the solution again and isolated the nanoparticles by centrifugation. The clear supernatant was decanted, the precipitates were dispersed in 8 ml anhydrous toluene, and centrifugated at 3000 rpm for 1 min and only the brown supernatant was collected.

As for the synthesis of other chalcopyrite nanoparitices, all the procedures were kept exactly the same while 0.2 mmol InCl$_3$ for CuInSe$_2$, 0.1 mmol In(acac)$_3$) and 0.1 mmol (Ga (acac)$_3$) for CuInGaSe$_2$ were used, respectively.

In performing structural, optical and electrical characterization of chalcopyrite nanoparticles, transmission electronic microscopy (TEM) and selected area electron diffraction (SAED) were done on an EOL-2010-FEG microscope equipped with a tungsten filament and operated under accelerating voltage of 200 kV. X-ray diffraction (XRD) was carried out in a Siemens diffractometer with Cu Kα radiation (λ=1.54175 Å). Vis-near-NIR absorption spectra of Chalcopyrite nanoparticles in toluene were recorded at room temperature using a Cary 500 UV/vis/near-IR spectrophotometer. For ICP measurements, samples were acid digested, diluted with 18 mOhm water and assayed on a Perkin Elmer Model Optima 3000DV ICP AEOS.

The embodiments described herein include a composite material comprising: semiconductor nanocrystals; and organic molecules that passivate the surfaces of the semiconductor nanocrystals, wherein at least one property of the organic molecules facilitates the transfer of charge between the semiconductor nanocrystals.

The at least one property of an embodiment includes delocalization of at least one type of charge carrier across at least a portion of the organic molecules, wherein the at least one type of charge carrier includes at least one of electrons and holes.

The composite material of an embodiment comprises at least one benzene ring forming at least a portion of the organic molecules, wherein the at least one benzene ring results in the delocalization of the at least one type of charge carrier.

The semiconductor nanocrystals of an embodiment comprise at least one of PbS, PbSe, PbTe, CdS, CdSe, CdTe, SnS, SnSe, SnTe, Si, GaAs, Bi2S3, Bi2Se3, CuInS$_2$, CuInSe$_2$, Cu(InGa)Se$_2$ (CIGS), CuGaSe$_2$.

The organic molecules of an embodiment comprise at least one of Benzenedithiol, Dibenzenedithiol, Mercaptopropionic acid, Mercaptobenzoic acid, Pyridine, Pyrimidine, Pyrazine, Pyridazine, Dicarhoxybenzene, Benzenediamine, and Dibenzenediamine.

The embodiments described herein include a semiconductor material, the semiconductor material comprising a p-type semiconductor material including semiconductor nanocrystals, wherein at least one property of the semiconductor material results in a mobility of electrons in the semiconductor material being greater than or equal to a mobility of holes.

The embodiments described herein include a semiconductor material, the semiconductor material comprising an n-type semiconductor material including semiconductor nanocrystals, wherein at least one property of the semiconductor material results in a mobility of holes in the semiconductor material being greater than or equal to a mobility of electrons.

The embodiments described herein include a device comprising a semiconductor material in contact with a first electrode and a second electrode, wherein the semiconductor material is a p-type semiconductor material comprising semiconductor nanocrystals, wherein properties of the semiconductor material result in a mobility of electrons in the semiconductor material being greater than or equal to a mobility of holes.

The embodiments described herein include a device comprising a semiconductor material in contact with a first electrode and a second electrode, wherein the semiconductor material is an n-type semiconductor material comprising semiconductor nanocrystals, wherein properties of the semiconductor material result in a mobility of holes in the semiconductor material being greater than or equal to a mobility of electrons.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import, when used in this application, refer to this application as a whole and not to any particular portions of this application. When the word "or" is used in reference to a list of two or more items, that word covers all of the following interpretations of the word: any of the items in the list, all of the items in the list and any combination of the items in the list.

The above description of embodiments is not intended to be exhaustive or to limit the systems and methods to the precise forms disclosed. While specific embodiments of, and examples for, the embodiments are described herein for illustrative purposes, various equivalent modifications are possible within the scope of the systems and methods, as those skilled in the relevant art will recognize. The teachings of the embodiments provided herein can be applied to other systems and methods, not only for the systems and methods described above.

The elements and acts of the various embodiments described above can be combined to provide further embodiments. These and other changes can be made to the embodiments in light of the above detailed description.

In general, in the following claims, the terms used should not be construed to limit the embodiments to the specific embodiments disclosed in the specification and the claims, but should be construed to include all systems that operate under the claims. Accordingly, the embodiments are not limited by the disclosure, but instead the scope of the embodiments is to be determined entirely by the claims.

While certain aspects of the embodiments are presented below in certain claim forms, the inventors contemplate the various aspects of the embodiments in any number of claim forms. Accordingly, the inventors reserve the right to add additional claims after filing the application to pursue such additional claim forms for other aspects of the embodiments.

What is claimed is:

1. A method of making ternary or quaternary chalcopyrite nanoparticles, the method including:
    preparing a first solution and bringing it to a first temperature, the first solution including salts that include at least one metal selected from the group including copper (Cu), indium (In), and gallium (Ga);
    preparing a second solution and bringing it to a second temperature, the second solution including selenium powder dissolved in oleylamine, the second temperature being in the range of about 200° C. to about 300° C.; and
    injecting the second solution into the first solution.

2. The method of claim 1, wherein the first solution includes a salt selected from the list including at least one of the following: $Cu(acac)_2$, $In(acac)_3$, and $Ga(acac)_3$.

3. A method of making ternary or quaternary chalcopyrite nanoparticles, the method including:
    preparing a first solution and bringing it to a first temperature, the first solution including a salt selected from the list including at least one of the following: $Cu(acac)_2$, $In(acac)_3$, and $Ga(acac)_3$;
    preparing a second solution and bringing it to a second temperature, the second solution including selenium powder dissolved in oleylamine, the second temperature being in the range of about 200° C. to about 300° C.; and
    injecting the second solution into the first solution.

* * * * *

UNITED STATES PATENT AND TRADEMARK OFFICE
CERTIFICATE OF CORRECTION

PATENT NO.       : 8,415,192 B2
APPLICATION NO.  : 13/235159
DATED            : April 9, 2013
INVENTOR(S)      : Sargent et al.

It is certified that error appears in the above-identified patent and that said Letters Patent is hereby corrected as shown below:

On the title page, in column 1, under Item "(60) Related U.S. Application Data", line 10, delete "61/026, 650," and insert --61/026,650,--, therefor.

On the title page, in column 2, under item (56) "Other Publications", line 2, delete "5pgs" and insert --5 pgs.--, therefor On title page 2, in column 2, under item (56) "Foreign Patent Documents", line 2, delete "WO-2008131313 A2 10/2008", therefor On title page 2, in column 2, under item (56) "Other Publications", line 3, delete "Mailed" and insert --mailed--, therefor On title page 2, in column 2, under item (56) "Other Publications", line 11, delete "08746379.0-" and insert --08746379.0,--, therefor On title page 2, in column 2, under item (56) "Other Publications", line 11, after "Action", insert --mailed--, therefor On title page 3, in column 1, under item (56) "Other Publications", line 9, delete "12/426,854" and insert --12/426,854,--, therefor On title page 3, in column 1, under item (56) "Other Publications", line 38, delete "Vol." and insert --vol.--, therefor On title page 3, in column 1, under item (56) "Other Publications", line 38, delete "1" and insert --1,--, therefor On title page 3, in column 2, under item (56) "Other Publications", line 1, delete "J," and insert --J.,--, therefor Signed and Sealed this
Twenty-third Day of December, 2014

Michelle K. Lee
*Deputy Director of the United States Patent and Trademark Office*

CERTIFICATE OF CORRECTION (continued)
U.S. Pat. No. 8,415,192 B2

On title page 3, in column 2, under item (56) "Other Publications", line 3, delete "D," and insert --D.,--, therefor On title page 3, in column 2, under item (56) "Other Publications", line 8, delete "Morley M." and insert --Morley, M.,--, therefor On title page 3, in column 2, under item (56) "Other Publications", line 16, delete "mailed" and insert --filed--, therefor On title page 3, in column 2, under item (56) "Other Publications", line 18, delete "13/235,134 ," and insert --13/235,134,--, therefor On title page 3, in column 2, under item (56) "Other Publications", line 22, delete "mailed" and insert --filed--, therefor On title page 3, in column 2, under item (56) "Other Publications", line 24, delete "13/235,185 ," and insert --13/235,185,--, therefor On title page 3, in column 2, under item (56) "Other Publications", line 30, delete "mailed" and insert --filed--, therefor In the Specification In column 1, line 8, delete "2009" and insert --2009,--, therefor In column 1, line 57, after "half", insert --of--, therefor In column 2, line 17, delete "muttijunction" and insert --multijunction--, therefor In column 3, line 63, delete "nanoparticies" and insert --nanoparticles--, therefor In column 3, line 66, delete "nanoparticies" and insert --nanoparticles--, therefor In column 4, line 2, delete "nanoparticies" and insert --nanoparticles--, therefor In column 4, line 5, delete "nanoparticies" and insert --nanoparticles--, therefor In column 4, line 10, delete "nanoparticies" and insert --nanoparticles--, therefor In column 4, line 13, delete "nanoparticies" and insert --nanoparticles--, therefor In column 4, line 14, delete "nanoparticies" and insert --nanoparticles--, therefor In column 4, line 27, delete "nanoparticies" and insert --nanoparticles--, therefor In column 4, line 30, delete "nanoparticies" and insert --nanoparticles--, therefor In column 4, line 33, delete "nanoparticies" and insert --nanoparticles--, therefor

CERTIFICATE OF CORRECTION (continued)
U.S. Pat. No. 8,415,192 B2

In column 4, line 36, delete "nanoparticies" and insert --nanoparticles--, therefor In column 4, line 39, delete "nanoparticies" and insert --nanoparticles--, therefor In column 4, line 43, delete "nanoparticies" and insert --nanoparticles--, therefor In column 4, line 55, delete "nanoparticies" and insert --nanoparticles--, therefor In column 4, line 61, delete "nanoparticies" and insert --nanoparticles--, therefor In column 4, line 65, delete "nanoparticies" and insert --nanoparticles--, therefor In column 6, line 7-8, delete "Bi2S3; Bi2Se3; CuInS2; CuInSe2; Cu(InGa)Se2" and insert --$Bi_2S_3$; $Bi_2Se_3$; $CuInS_2$; $CuInSe_2$; $Cu(InGa)Se_2$--, therefor In column 6, line 8, delete "CuGaSe2." and insert --$CuGaSe_2$.--, therefor In column 6, line 39, delete "multi junction" and insert --multi-junction--, therefor In column 8, line 13, delete "triple junction" and insert --triple-junction--, therefor In column 8, line 13, before "cell.", insert --solar--, therefor In column 8, line 31, delete "m W" and insert --mW--, therefor In column 8, line 42, delete "the" and insert --that--, therefor In column 9, line 30, after "large", delete "a", therefor In column 10, line 32, delete "maximizing" and insert --maximize--, therefor In column 10, line 56, delete "$mWcm^{-2}$" and insert --$mW\ cm^{-2}$--, therefor In column 11, line 16, delete "nm" and insert --nm)--, therefor In column 11, line 17, delete "(W-65" and insert --(W~65--, therefor In column 14, line 1, delete "embodiment" and insert --embodiment.--, therefor In column 15, line 61, delete "um" and insert --μm--, therefor In column 16, line 9, delete "Vbi" and insert --$V_{bi}$--, therefor In column 17, line 8, delete "crosslinking" and insert --crosslinking.--, therefor In column 17, line 54, after "(TMSe);", insert --and--, therefor In column 19, line 41, delete "um" and insert --μm--, therefor In column 20, line 26, delete "Se;" and insert --Se,--, therefor

CERTIFICATE OF CORRECTION (continued)

U.S. Pat. No. 8,415,192 B2

In column 20, line 50-51, delete "nanoparticies" and insert --nanoparticles--, therefor In column 20, line 52, delete "nanoparticies" and insert --nanoparticles--, therefor In column 20, line 64, delete "nanoparticies" and insert --nanoparticles--, therefor In column 21, line 12, after "closely", insert --to--, therefor In column 21, line 30, delete "S4A" and insert --24A--, therefor In column 21, line 46, delete "S2)." and insert --22).--, therefor In column 21, line 60, delete "Cu(acac)$_2$" and insert "Cu(acac)$_2$,--, therefor In column 21, line 65, delete "C." and insert --C.,--, therefor In column 21, line 66-67, delete "nanoparticies" and insert --nanoparticles--, therefor In column 22, line 12, delete "nanoparticies" and insert --nanoparticles--, therefor In column 22, line 14, delete "(ICP)." and insert --(ICP-AES).--, therefor In column 22, line 43, delete "was" and insert --were--, therefor In column 22, line 49, delete "nanoparticies" and insert --nanoparticles--, therefor In column 22, line 65, delete "CuGaSe2, CuInSe2" and insert --CuGaSe$_2$., CuInSe$_2$--, therefor In column 22, line 66, delete "nanoparticies" and insert --nanoparticles--, therefor In column 23, line 36, delete "nanoparticies" and insert --nanoparticles--, therefor In column 23, line 38, delete "In(acac)$_3$)" and insert --(In(acac)$_3$)--, therefor In column 24, line 3, delete "Bi2S3, Bi2Se3," and insert --Bi$_2$S$_3$, Bi$_2$Se$_3$,--, therefor